(12) United States Patent
Rahimo

(10) Patent No.: US 12,557,311 B2
(45) Date of Patent: Feb. 17, 2026

(54) SEMICONDUCTOR DEVICE

(71) Applicant: MQ SEMI AG, Zug (CH)

(72) Inventor: Munaf Rahimo, Solothurn (CH)

(73) Assignee: MQ SEMI AG, Zug (CH)

( * ) Notice: Subject to any disclaimer, the term of this patent is extended or adjusted under 35 U.S.C. 154(b) by 435 days.

(21) Appl. No.: 18/257,038

(22) PCT Filed: Dec. 10, 2021

(86) PCT No.: PCT/EP2021/085225
§ 371 (c)(1),
(2) Date: Jun. 12, 2023

(87) PCT Pub. No.: WO2022/123026
PCT Pub. Date: Jun. 16, 2022

(65) Prior Publication Data
US 2024/0047563 A1  Feb. 8, 2024

(30) Foreign Application Priority Data

Dec. 11, 2020 (GB) ..................................... 2019586

(51) Int. Cl.
| | |
|---|---|
| *H10D 12/00* | (2025.01) |
| *H10D 62/10* | (2025.01) |
| *H10D 62/17* | (2025.01) |
| *H10D 64/23* | (2025.01) |
| *H10D 64/27* | (2025.01) |

(52) U.S. Cl.
CPC ......... *H10D 12/481* (2025.01); *H10D 62/127* (2025.01); *H10D 62/393* (2025.01); *H10D 64/231* (2025.01); *H10D 64/513* (2025.01)

(58) Field of Classification Search
CPC .. H10D 12/481; H10D 62/127; H10D 62/393; H10D 64/513; H10D 64/231
USPC ......................................................... 257/288
See application file for complete search history.

(56) References Cited

U.S. PATENT DOCUMENTS

| | | | |
|---|---|---|---|
| 2003/0116807 A1 | 6/2003 | Matsuda | |
| 2007/0252195 A1 | 11/2007 | Yoshikawa | |
| 2010/0327313 A1* | 12/2010 | Nakamura | ........... H10D 62/142 |
| | | | 257/133 |

(Continued)

FOREIGN PATENT DOCUMENTS

WO      2011118512 A1    9/2011

OTHER PUBLICATIONS

International Search Report dated Mar. 28, 2022 for corresponding International Application No. PCT/EP2021/085225.

*Primary Examiner* — Igwe U Anya
(74) *Attorney, Agent, or Firm* — Tarolli, Sundheim, Covell & Tummino LLP

(57) ABSTRACT

A Metal Oxide Semiconductor (MOS) transistor cell design has a source region and a first base layer extending in a third dimension. When a control voltage greater than a threshold value is applied on the gate trench, electrons flow from a singular point within the source region, into a radial MOS channel formed on the lateral walls of those trench regions surrounded by the first base layer, but not abutting on the higher doped second base layer. The MOS channel width is determined by a quadrant centred on the singular point and with a radius equal to the separation region between the singular point and the maximum surface doping concentration point in the first base layer.

24 Claims, 27 Drawing Sheets

(56) References Cited

U.S. PATENT DOCUMENTS

| | | | |
|---|---|---|---|
| 2014/0110797 A1 | 4/2014 | Tatemichi | |
| 2014/0332845 A1* | 11/2014 | Bobde | H10D 62/127 |
| | | | 438/138 |
| 2017/0069740 A9 | 3/2017 | Bobde | |
| 2019/0181255 A1 | 6/2019 | Nagata | |
| 2021/0043734 A1* | 2/2021 | Rahimo | H10D 62/393 |
| 2021/0104614 A1* | 4/2021 | Rahimo | H10D 12/481 |
| 2021/0134989 A1* | 5/2021 | Rahimo | H10D 30/66 |

* cited by examiner

SEMICONDUCTOR DEVICE

RELATED APPLICATIONS

The present application is a U.S. National Stage application under 35 USC 371 of PCT Application Serial No. PCT/EP2021/085225, filed on 10 Dec. 2021; which claims priority from GB Patent Application No. 2019586.3, filed 11 Dec. 2020, the entirety of both of which are incorporated herein by reference.

FIELD OF THE INVENTION

The invention relates to the field of power semiconductor devices. More particularly it relates to a power semiconductor device having multiple transistor cells, with layers of different conductivity types.

TECHNICAL BACKGROUND

Improving the electrical performance of power semiconductors like IGBTs and MOSFETs has been the driving force in the power semiconductors industry for the last decades. Various transistor cell designs have been proposed with the goal of improving the electron-hole concentration (plasma concentration) in the device. For IGBTs, typical Planar and Trench cell designs are shown in FIG. 1A and 2A. Both designs can incorporate an enhancement n-type layer for improved plasma concentration as shown in FIG. 1B and 2B. A fully functional device will be obtained by structuring numerous transistor cells on the same starting material wafer.

In GB Patent Application No. 1910012.2, a novel transistor cell design is proposed, combining the advantages of using both planar and trench gate electrodes, to achieve for example IGBTs with improved on-state performance, good controllability and low switching losses.

When a suitable control or gate voltage is applied on planar and trench gate electrodes, which are electrically interconnected, a planar MOS channel is formed on the emitter surface. Simultaneously, an additional MOS channel is formed along the lateral walls of the trench recesses embedding the second gate electrodes. This additional MOS channel is connected in parallel with the planar MOS channel and provide an unobstructed flow path for electrons from the source regions to the drift layer. Consequently, the device enters the conduction mode and is characterized by an on-state voltage drop smaller than traditional transistor cell designs.

The cell design disclosed in the GB Patent Application No. 1910012.2 adopts mesa widths (trench to trench distance) below 1 μm to achieve very low conduction losses, because closely packed trenches can provide a strong barrier to hole drainage and improved reverse bias blocking performance. Matching such a performance is possible with the described novel design having the less complex processes, i.e. the region in between two adjacent trenches must not be further structured to create contact opening, source regions, or other structures.

In performing detailed TCAD simulations of the prior art transistor cell as disclosed in GB Patent Application No. 1910012.2, the following phenomena were observed. The inventors performed conduction mode and switching simulations under the following conditions: (1) the planar gate electrode layer is omitted; (2) the planar and trench gate electrodes are electrically disconnected so that the planar gate electrode can be electrically grounded or floated independent of the electrical potential applied on the trench gate electrodes; or (3) the thickness of the insulating layer for the planar gate is increased by comparison with the thickness of the trench insulating layer.

It was discovered that the on-state performance of the simulated power devices under conditions (1), (2) or (3) is almost similar to that of the original prior art device. Instead, the capacitance of the device is reduced, which may lead to lower switching losses and improved controllability.

This effect can be understood by the following phenomenon: under any of the above simulated conditions, there will be no inversion layer formed under the planar gate electrode, and thus no planar MOS channel will be formed on the emitter side of the p base layer. Instead, the electron charge carriers from the n source region can be transported to the drift layer through an inversion layer formed on the side walls of the trench recesses embedding the trench gate electrodes. The electrons will flow from the edge of the n source region along the side walls of adjacent trench recesses, in different radial directions, which are defined by the outermost boundary of the first p base layer (i.e. channels). At the same time, by omitting the planar gate electrode, or by disconnecting the set of planar and trench gate electrodes from each other, there will be no capacitance associated with the planar electrodes, so the overall capacitance of the device is reduced.

SUMMARY

The power semiconductor described herein comprises multiple transistor cells, each transistor cell comprising a drift layer of a first conductivity type, which is arranged between the emitter side and the collector side separated in a first dimension, a first base layer of a second conductivity type, which is arranged between the drift layer and the emitter electrode, and a source region of the first conductivity type, which is arranged at the emitter side embedded into the first base layer and contacts the emitter electrode, which source region has a higher doping concentration than the drift layer. Furthermore, a second base layer of the second conductivity type is arranged at the emitter side embedded into the first base layer and extends deeper than the source region in the first dimension, and contacts the emitter electrode through a contact opening. The second base layer region has a higher doping concentration than the first base layer, and can extend in a second dimension to partially or fully protect/overlap the bottom side of the source region. The first and the second base layers and the source regions extend in a top view plane in a third dimension. A plurality of first trench gate electrodes, each of which is electrically insulated from the first base layer, second base layer, source region and the drift layer by a first insulating layer are arranged on the emitter side orthogonally to the third dimension and extends deeper into the drift layer than the first base layer.

The power semiconductor may further comprise trenches shaped with respective stripes. The first base layer, the source region and the second base layer may be shaped with respective stripes in orthogonal direction to the stripes of the trenches, and the stripe of the first base layers, source region and second base layer may be divided into rectangles spaced apart from each other by the stripes of the trenches.

Alternatively, the first base, source region and second base layer may be shaped with respective stripes, the trenches may be shaped with respective stripes in orthogonal direction to the stripes of the first base layer, source region and second base layer, and the stripe of the trenches may be divided into rectangles spaced apart from each other by the stripes of the first base layer, source region and second base layer.

The power semiconductor may further comprise a second insulating layer that electrically protects the first base layer, the source region and the drift layer on the first surface.

Some of the first gate electrodes may be electrically connected to the emitter electrode and/or all or some of the first gate electrodes may be electrically floating.

Optionally, a second gate electrode may be added to provide a planar channel. The second gate electrode is arranged on the emitter side of the drift layer, and is electrically insulated from the first base layer, the source region and the drift layer by the second insulating layer.

The power semiconductor may further be characterized in that the thickness of the second insulating layer is larger than the thickness of the first insulating layer. Alternatively, the chemical composition may be different between the two insulating layers, more specifically the dielectric constant of the first insulating layer may be smaller than that of the second insulating layer.

Alternatively, the first and second gate electrodes may not be electrically connected with each other, i.e. the second gate electrode may be made floating or can be grounded, while the first gate electrode remains controlled by a gate potential.

All or some of the second gate electrodes may be electrically connected to the emitter electrode and/or all or some of the second gate electrodes may be electrically floating.

A power semiconductor device comprising a buffer layer of the first conductivity type with a higher doping concentration than the drift layer, which buffer layer is arranged on the collector side between the drift layer and the collector electrode; and a collector layer of the second conductivity type, which is arranged on the collector side between the buffer layer and the collector electrode is also described.

The power semiconductor device may comprise an enhancement layer of the first conductivity type arranged between, and thereby separating, the drift layer and the first base layer.

The power semiconductor may be a reverse conducting type device with a collector short layer of the first conductivity type arranged at the collector side between the collector electrode and buffer layer.

A distance between the lateral walls of two adjacent trench gates in the third dimension may be in a range from about 5 μm to below 0.1 μm, more preferably from 1 μm to 0.1 μm A distance between adjacent trenches in the second dimension extends approximately in a range from about 20 μm to about 1 μm, preferably from 5 μm to 1 μm, and more preferably from 2 μm to 1 μm.

The power semiconductor device may have a stripe layout design or cellular layout design.

A semiconductor module package comprising a single or multiple power semiconductor devices as described above. We also describe herein a converter with a plurality of power semiconductor devices arranged in power modules is also described.

It is an object of the invention to provide a power semiconductor device with reduced on-state losses, low drainage of holes, stable gate parameters, improved blocking capability, and good controllability.

It may also be an object of the present invention to provide a Trench Insulated Gate Bipolar Transistor IGBT with improved electrical characteristics.

These objects may be met by the subject matter of the independent claims. Embodiments of the invention are described with respect to the dependent claims.

According to a first aspect of the invention, we describe a power semiconductor device with multiple transistor cells, each cell comprising a first surface and a second surface separated in a first dimension, wherein an emitter electrode is operatively connected to the first surface and a collector electrode is operatively connected to the second surface, and wherein each transistor cell further comprises:

a drift layer of a first conductivity type located between the first surface and the second surface;

a first base layer of a second conductivity type arranged between the drift layer and the emitter electrode, and having a region of maximum surface doping concentration;

a source region of the first conductivity type located within the first base layer and operatively connected to the emitter electrode, wherein a doping concentration of the source region is greater than a doping concentration of the drift layer, and having a singular point at the surface corresponding to the edge of the ion implantation mask used to form the source region;

a second base layer of the second conductivity type located within the first base layer and extending deeper than the source region, wherein a doping concentration of the second base layer region is greater than a doping concentration of the first base layer, wherein at least a region of the second base layer is operatively connected to the emitter electrode via a contact opening;

a plurality of trench regions extending in the second dimension, each comprising a first gate electrode and a first insulating layer, the first insulating layer electrically insulating the first gate electrode from the first base layer, the second base layer, the source region and the drift layer, wherein one or more of trench regions abut the source region such that a singular point is on each lateral trench wall abutting the source region;

a second insulating layer that electrically protects the first base layer, the source region and the drift layer on the first surface;

wherein the emitter electrode is separated from the first insulating layer, second insulating layer, first gate electrodes by a third insulating layer.

It will be understood that the first dimension corresponds to the direction of the separation of the emitter and collector electrodes, while the second dimension corresponds to the direction of the length of the trench regions. It will be further understood that the device may extend in a third dimension orthogonal to the first and second dimensions. The first, second and third dimensions generally align with the X, Y and Z dimensions respectively as shown in FIG. 3.

The new transistor cell design offers a wide range of advantages both in terms of performance (reduced losses, improved controllability and reliability), and processability (very narrow mesa design rules, reliable process compatibility) with the potential of applying enhanced layer or reverse conducting structures. The inventive design is suitable for full or partial stripes designs, but can also be implemented in cellular designs. Due to the fact that the area in between the orthogonal gate trenches does not need to be further structured, very high-density trench recesses can be used, with trench mesa dimensions reaching below 100 nm. This will significantly reduce the hole drainage effect as well known to experts in the field.

Unlike in traditional transistor cells, the MOS channel width is determined by a segment of a circle arranged uniquely on the lateral trench walls, centred at the singular point.

Some of the plurality of first gate electrodes can be grounded to the emitter electrode, or made floating. If the some of the first gate electrodes gates are shorted to the emitter electrode, there is no voltage differential between the first gate electrodes and effectively no capacitance. Since the first gates do not invert the first base region, the cell containing the first gate is a passive type of cell, as opposed to an active cell controlled by the gate trenches. By controlling the number of passive cells, the input capacitance of the device can be precisely controlled.

In some examples, the source region may be formed of multiple layers. Each layer may be produced by a separate ion implantation step and having a corresponding singular point. This is particularly relevant for drift layers made of wide bandgap materials such as Silicon Carbide, where the dopants are not diffusing after implantation.

In some examples, the source region may be formed of multiple layers as described previously, and the first insulating layer, the first base layer and each of the multiple layers may be configured to form a plurality of MOS channels on the lateral walls of the plurality of trench regions, each MOS channel being connected to one of the multiple layers of the source region.

Similarly, if some of the first gate electrodes are electrically floating, resulting in a passive cell, the potential floats up to the emitter voltage so there is effectively no capacitance associated with the first gate electrodes.

The inventive design is especially suitable for reverse conducting structures because the elimination of the vertical trench channel in the cell, and the presence of the highly doped second base layer in the trench regions for improved diode on-state losses. The new design can be applied to both vertical and lateral IGBTs and MOSFETs based on silicon or wide bandgap materials such as Silicon Carbide SiC.

The method for manufacturing a power semiconductor device, in particular an IGBT or MOSFET, has the advantage that one single mask is needed for structuring the emitter side with the base layers and the source region, by ion implantation and thermal diffusion. These layers are self-aligned by using the structured gate electrode layer as a mask. However, an additional mask must be used to structure the first surface of the power semiconductor if a second planar gate electrode is omitted.

BRIEF DESCRIPTION OF THE DRAWINGS

The embodiments of the invention will be explained in more detail in the following text with reference to the attached drawings, in which.

The reference symbols used in the figures and their meaning are summarized in the list of reference symbols. The drawings are only schematically and not to scale. Generally, alike or alike-functioning parts are given the same reference symbols. The described embodiments are meant as examples and shall not confine the invention.

DETAILED DESCRIPTION

Figure 3:
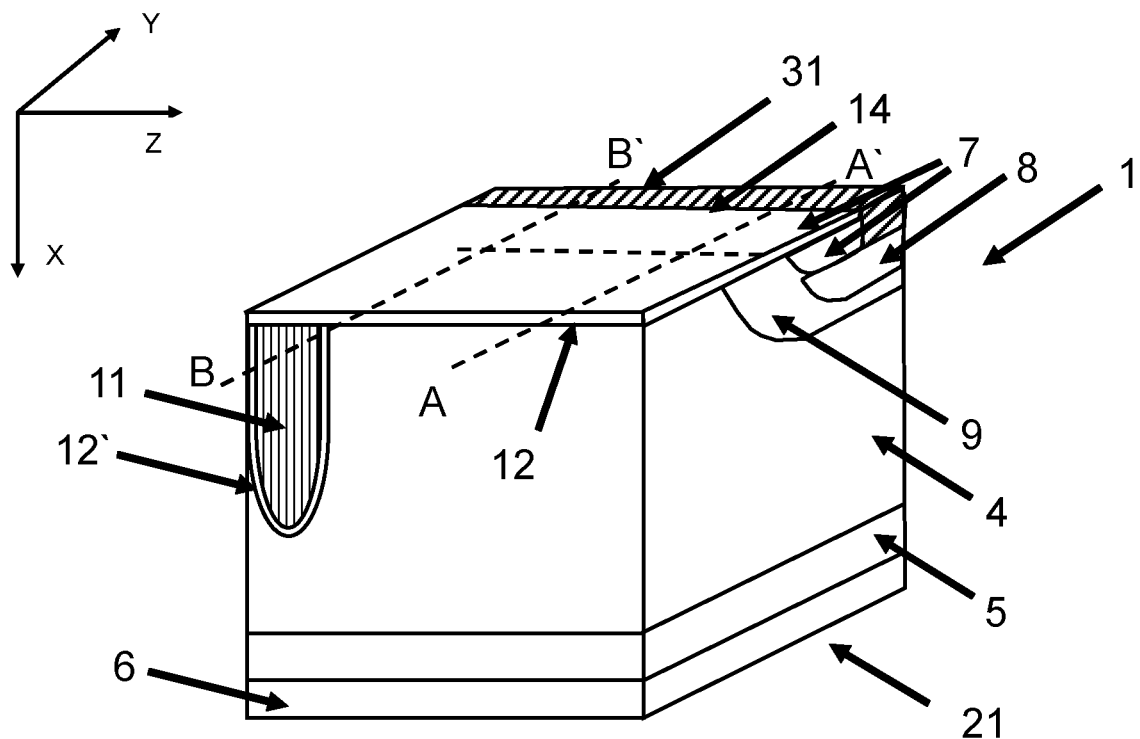
FIG. 3: shows a three-dimensional representation of the first example embodiment of a transistor cell according to the invention.
Figure 4A:
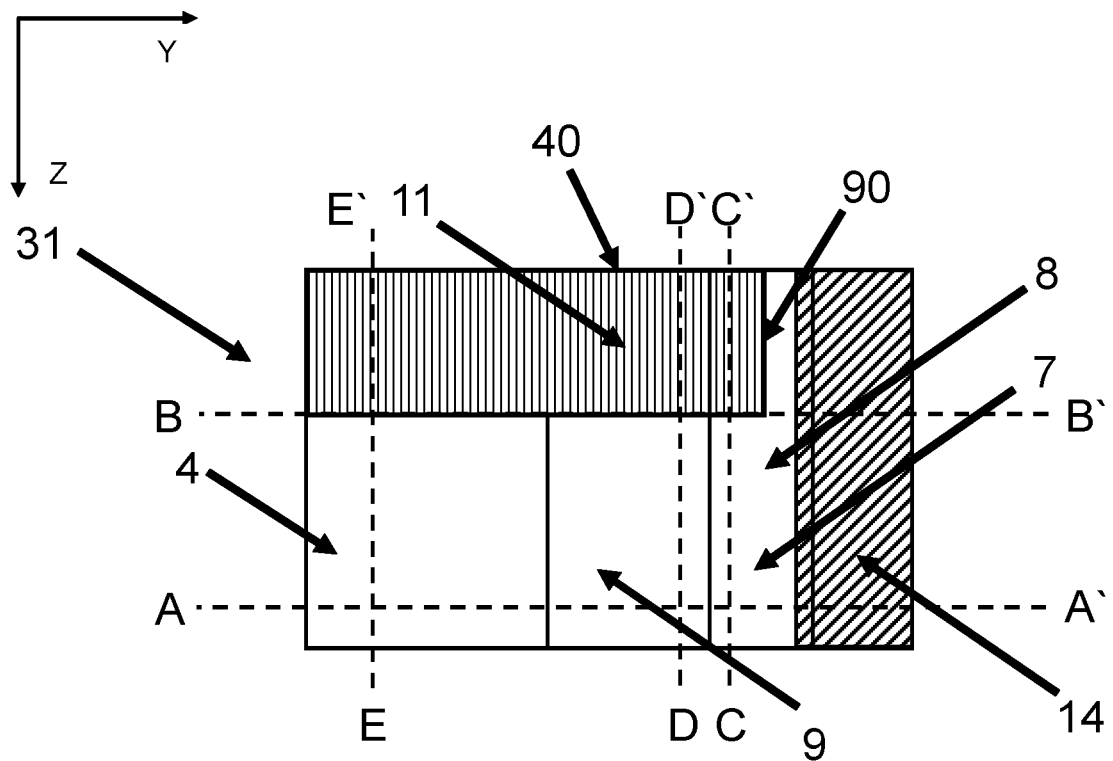
FIG. 4A: shows a top view of the first example embodiment of a transistor cell according to the invention.
Figure 4B:
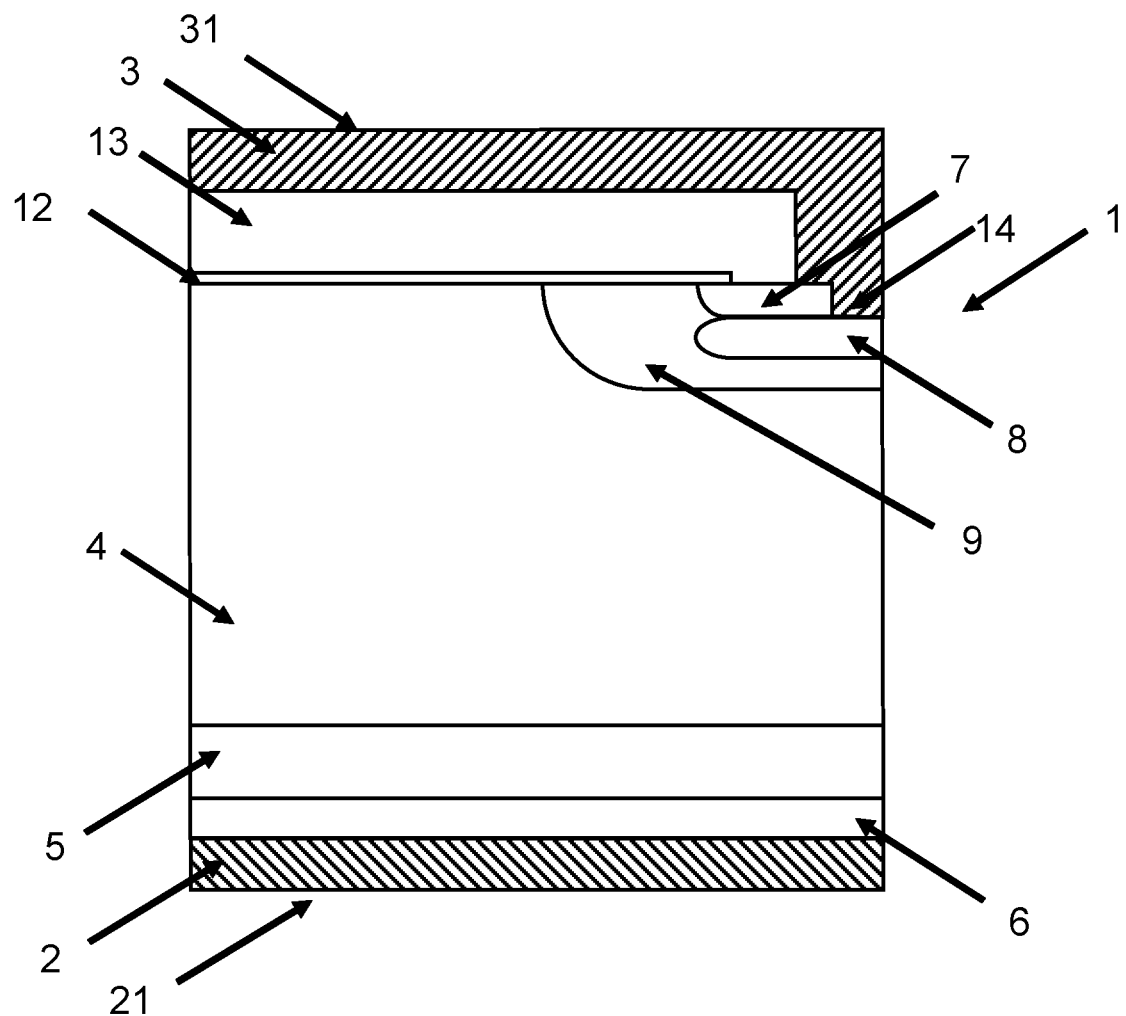
FIG. 4B-G: show the cross sections of the first example embodiment of a transistor cell according to different cut lines in FIG. 3. Some cross sections indicate the electron flow pathways in conduction mode.
Figure 4C:
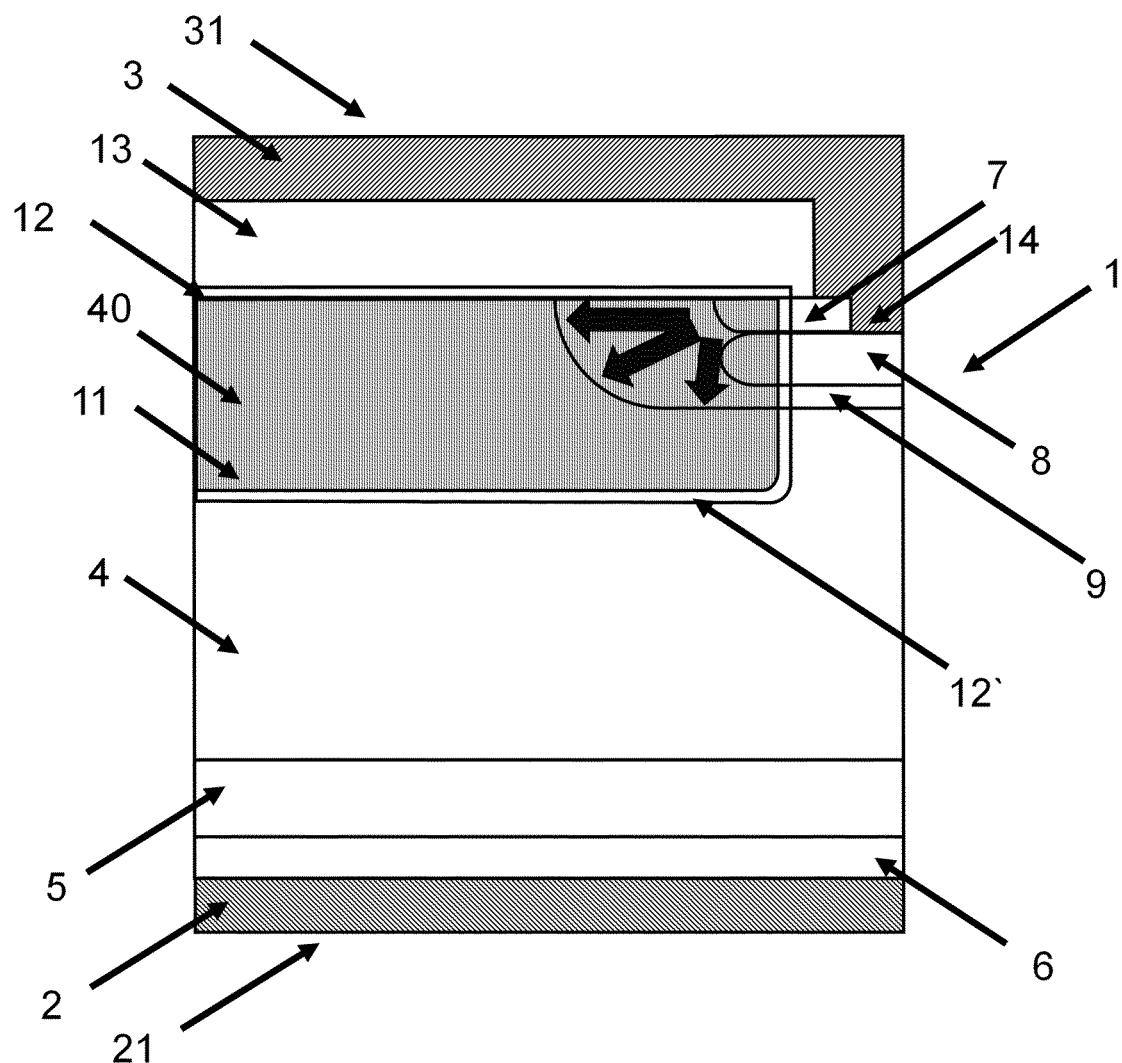

FIG. 3 shows a three-dimensional representation, and FIG. 4A a top view of the first exemplary embodiment of a transistor cell of a power semiconductor device 1 in form of a punch through insulated gate bipolar transistor (IGBT) with a four-layer structure (pnpn). FIG. 4B-F show more specific details in cross sections at different cut lines as depicted in FIG. 4A. The layers are arranged between an emitter electrode 3 on an emitter side 31 and a collector electrode 2 on a collector side 21, which is arranged opposite of the emitter side 31 in a first dimension. The IGBT transistor cell comprises an (n-) doped drift layer 4, which is arranged between the emitter side 31 and the collector side 21, and a p doped first base layer 9 arranged on the emitter side 31 of the drift layer 4 and extending into the drift layer in the first dimension, and in a top view plane in a third dimension. The transistor cell 1 also comprises an n doped source region 7, which is arranged at the emitter side 31 embedded into the first base layer 9, and directly contacting the emitter electrode 3. The source region 7 has a higher doping concentration than the drift layer 4, and extends in a top view plane in the third dimension.

The first base layer 9 and the source region 7 are usually formed by subsequent steps of implanting ion dopants through a mask such as the polysilicon gate cell opening. Each ion implant step is followed by thermal annealing and activation of the dopants. Because the two layers 7 and 9 have opposite dopant types, the out diffusion of dopants will locally compensate in all three directions X, Y, Z leading to the formation of a main p-n junction. For silicon-based drift layers, this is depicted schematically in FIG. 5, where it can be seen that the source region 7 will feature a singular point 100 closest to the edge of the mask for source region 7 and first base layer 9 ion implantation. At the singular point 100, the surface doping concentration of the source region 7 reaches a maximum value, after which is starts to decrease towards the p-n junction with the first base layer 9. The singular point 100 is a key feature of the power semiconductor device, as it defines the source region 7 and first base layer 9, and subsequently other key MOS parameters such as the channel width, channel length, threshold voltage, and the maximum doping concentration for supplying the electron charge carriers from the source region 7.

Figure 4D:
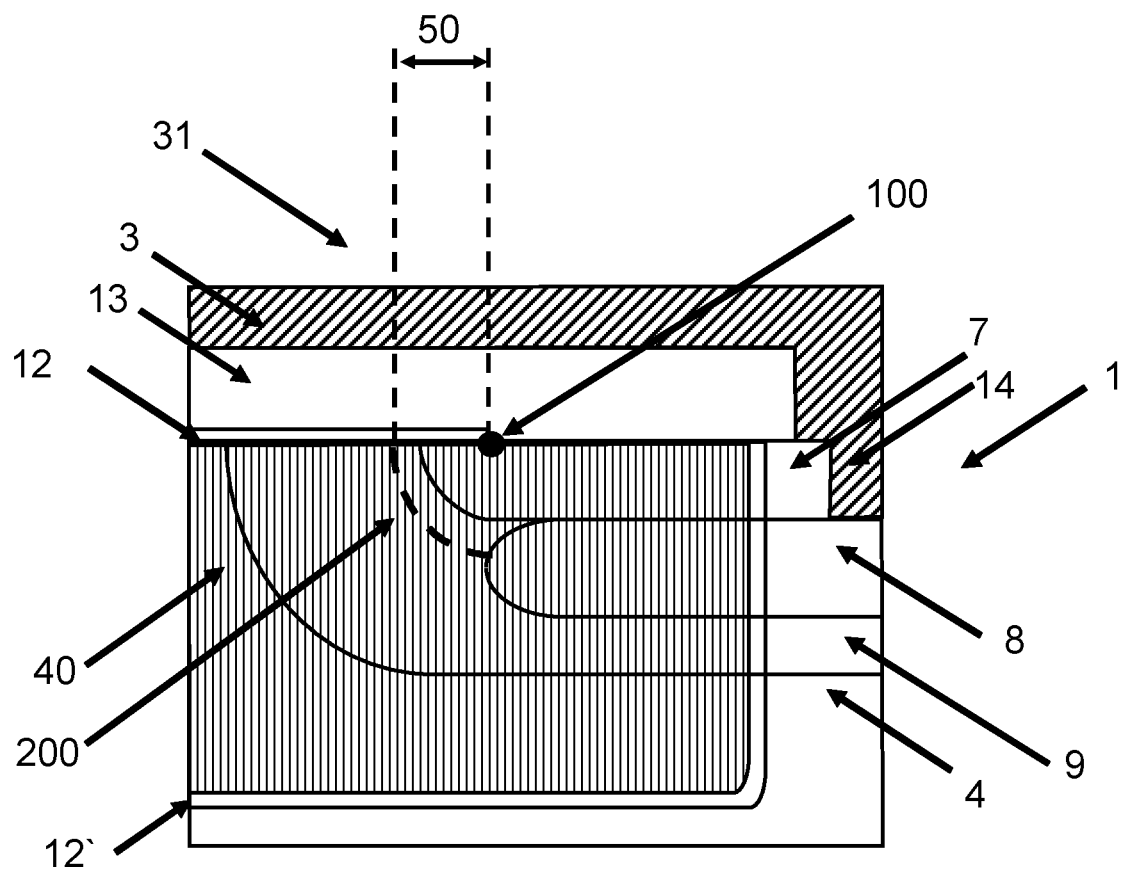
Figure 4E:
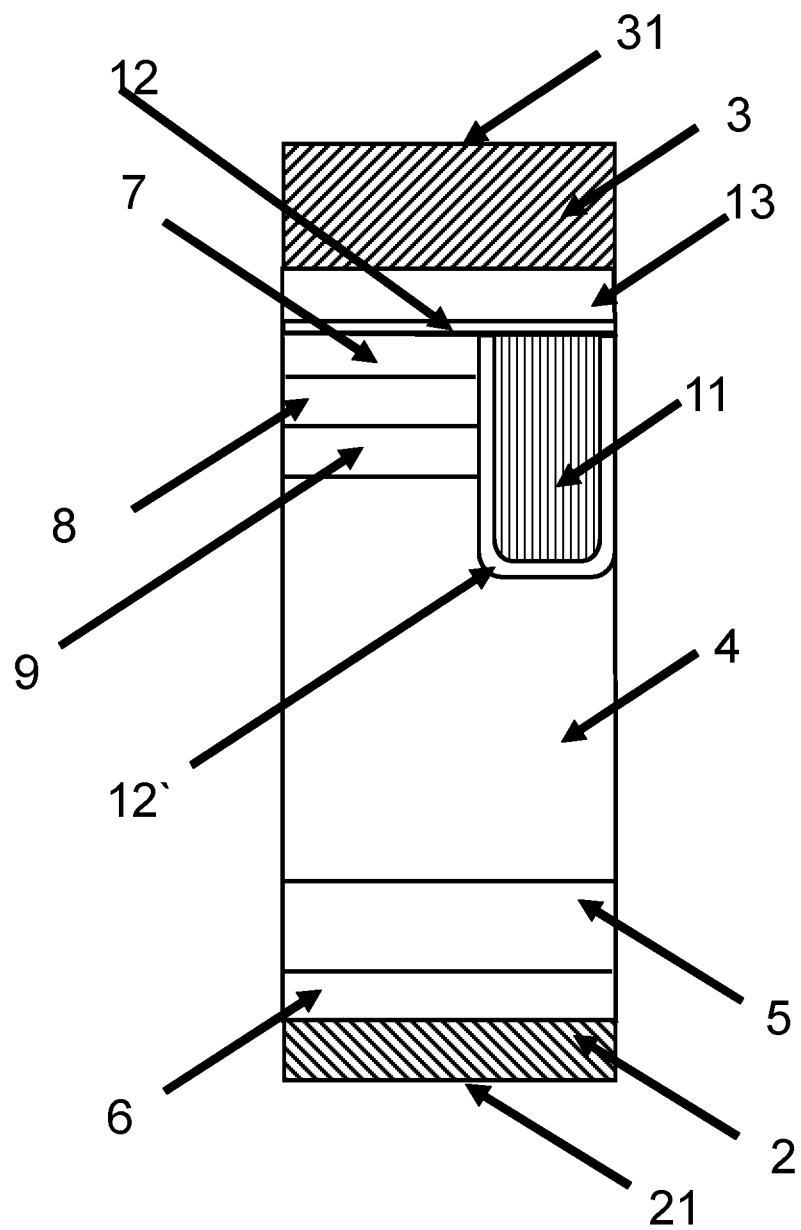
Figure 4F:
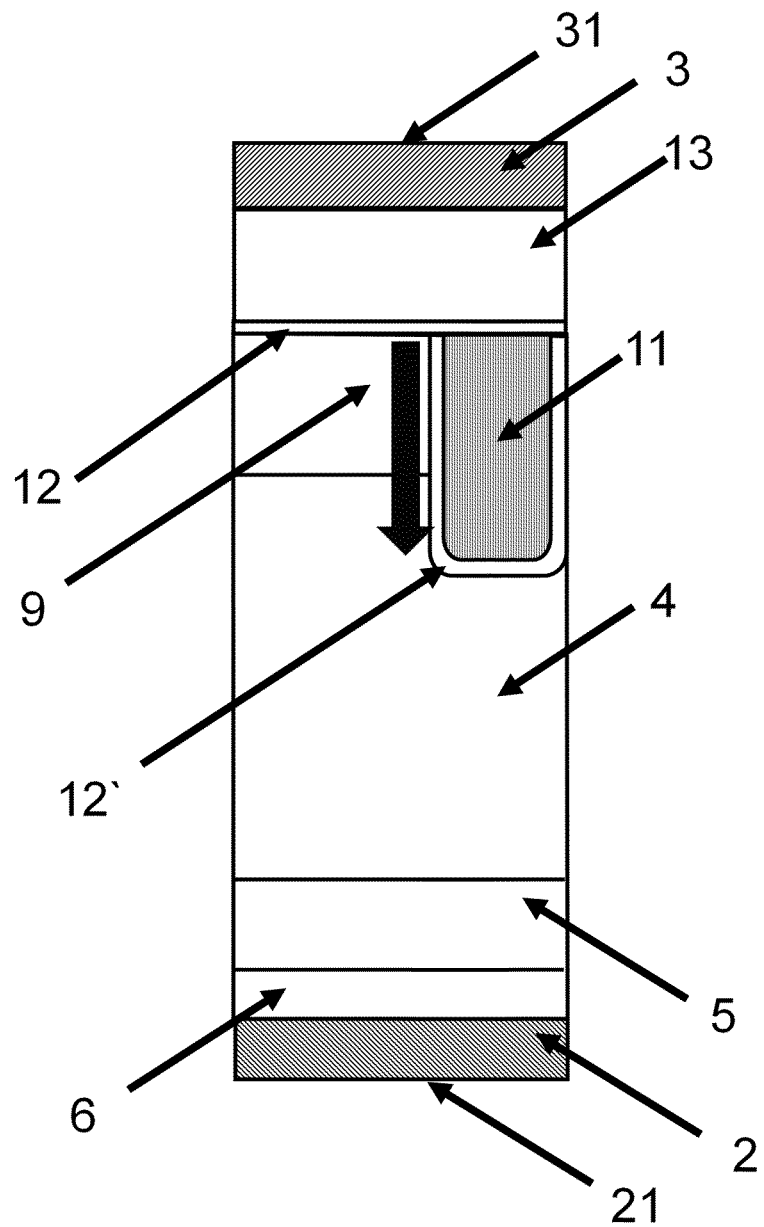
Figure 4G:
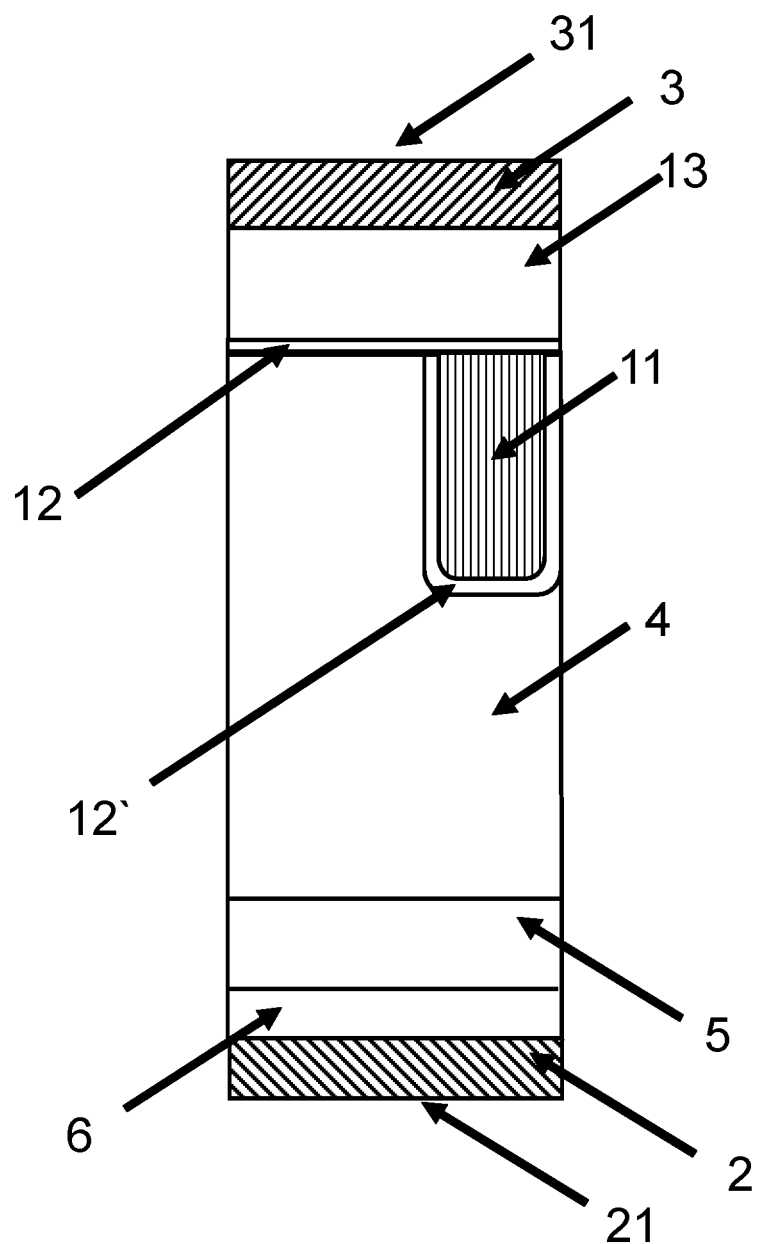
Figure 5:
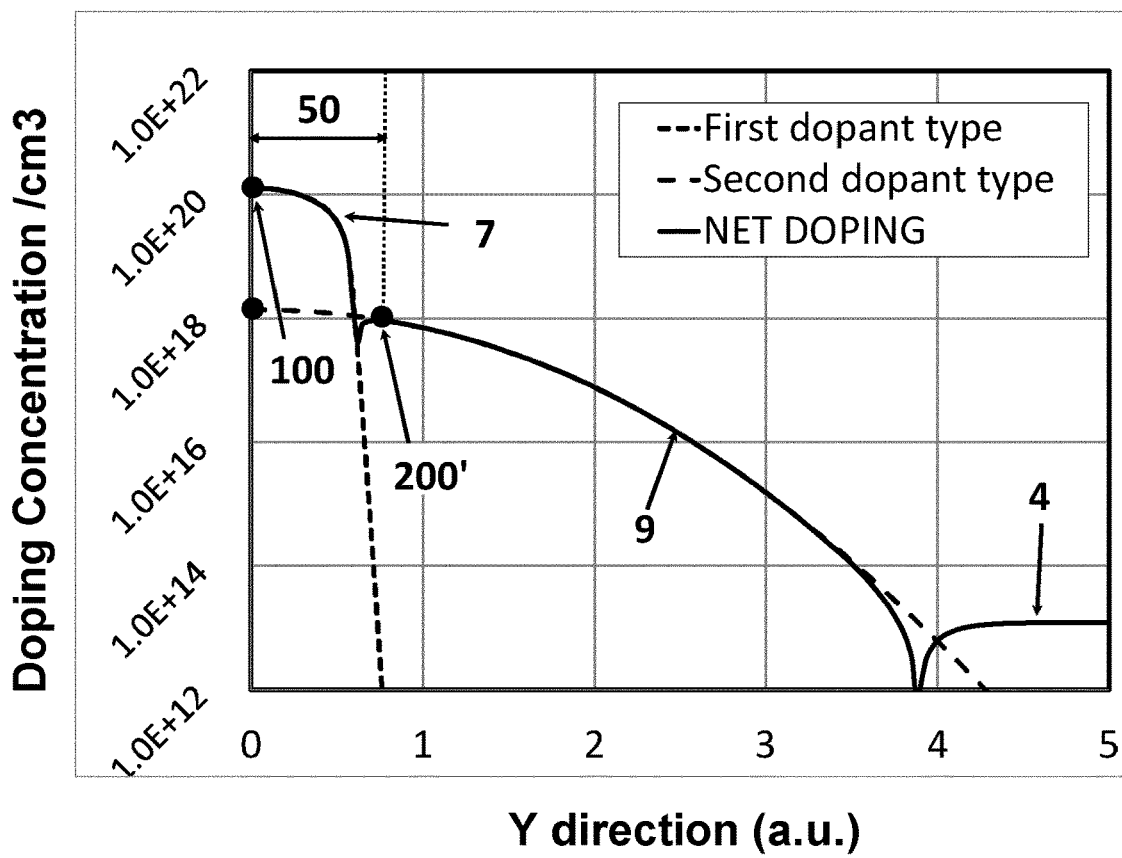
FIG. 5: shows the doping concentration profiles of the source region and first base layer, at the emitter surface of the drift layer.

It may be seen in FIG. 5 that the first base layer 9 will also feature a point 200' of maximum dopant concentration near the p-n junction, spaced apart from the singular point by a first separation region 50. This is the point at which the dopant concentration in the first base layer 9 sets the threshold voltage of the power transistor cell 1. In the X-Y plane the points 200' will define a segment of a circle or a quadrant, represented by a dotted line 200 in FIG. 4D which defines also the cell MOS channel width.

The innovative power semiconductor transistor cell 1 further comprises a p doped second base layer 8, which is arranged between the first base layer 9 and the emitter electrode 3, which second base layer 8 is in direct electrical contact to the emitter electrode 3. The second base layer 8 has a higher doping concentration than the first base layer 9. The second base layer 8 extends in the first dimension deeper than the source region, and in a top plane view in the third dimension. In the second dimension, the first edge of the second base layer is spaced apart by a second separation region 60 from the singular point 100 which has a length that can be 0 as represented in FIG. 4D, can be larger than 0 as represented in FIG. 6B, or can be negative (not shown).

Furthermore, a plurality of first gate electrodes 11 are embedded in corresponding trench recesses, each electrode 11 being electrically insulated from the first base layer 9, the second base layer 8, the source region 7 and the drift layer 4 by a first insulating layer 12'. The first gate electrodes 11 extend longitudinally in the second dimension, and are arranged at an angle of 90 degrees with respect to the third dimension, when observed in a top view plane. The trench recesses intersect both the source region 7 and the second base layer 8.

A second insulation layer 12 is arranged on the emitter side 31, protecting the surface of the drift layer 4, of the first base layer 9 and of the source region 7.

The trench regions and first gate electrodes 11 can be better viewed in the top cell view shown in FIG. 4A where the trench regions partially intersect the first base layer 9 and the source region 7, ie. the first end trench wall 90 is arranged in the source region 7. As the device may comprise one or more transistor cells 1, the inventive design consists of active trench gates 11, arranged in the regions between the first base layers 9 of adjacent transistor cells in the second dimension (Y direction).

In the case of prior art planar or trench MOSFETs or IGBTs, the effective channel width 201 was defined as the total outermost peripheral boundary of all the n source 7 regions. This approach is applied to various geometrical shapes of the MOS source regions or cells, being it of linear design such as a strip shape or of cellular design. In practice, the channel width 201 is more accurately defined not by the outermost boundary of the n source regions 7, but by the location of maximum surface dopant concentration points in the first base layer 9.

Figure 1A:
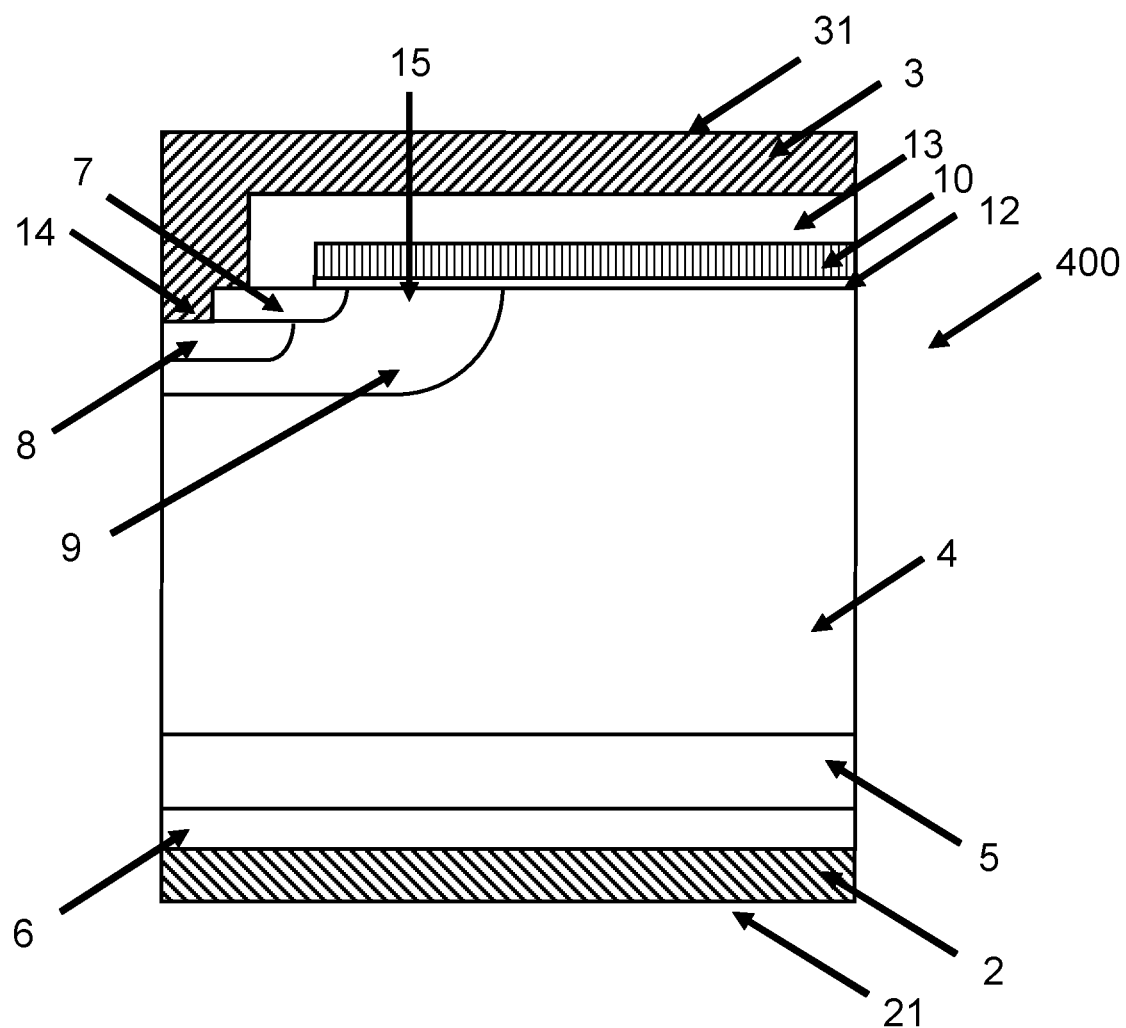
FIG. 1A-B: show the cross sections of Planar MOS IGBT structures (prior art).
Figure 1B:
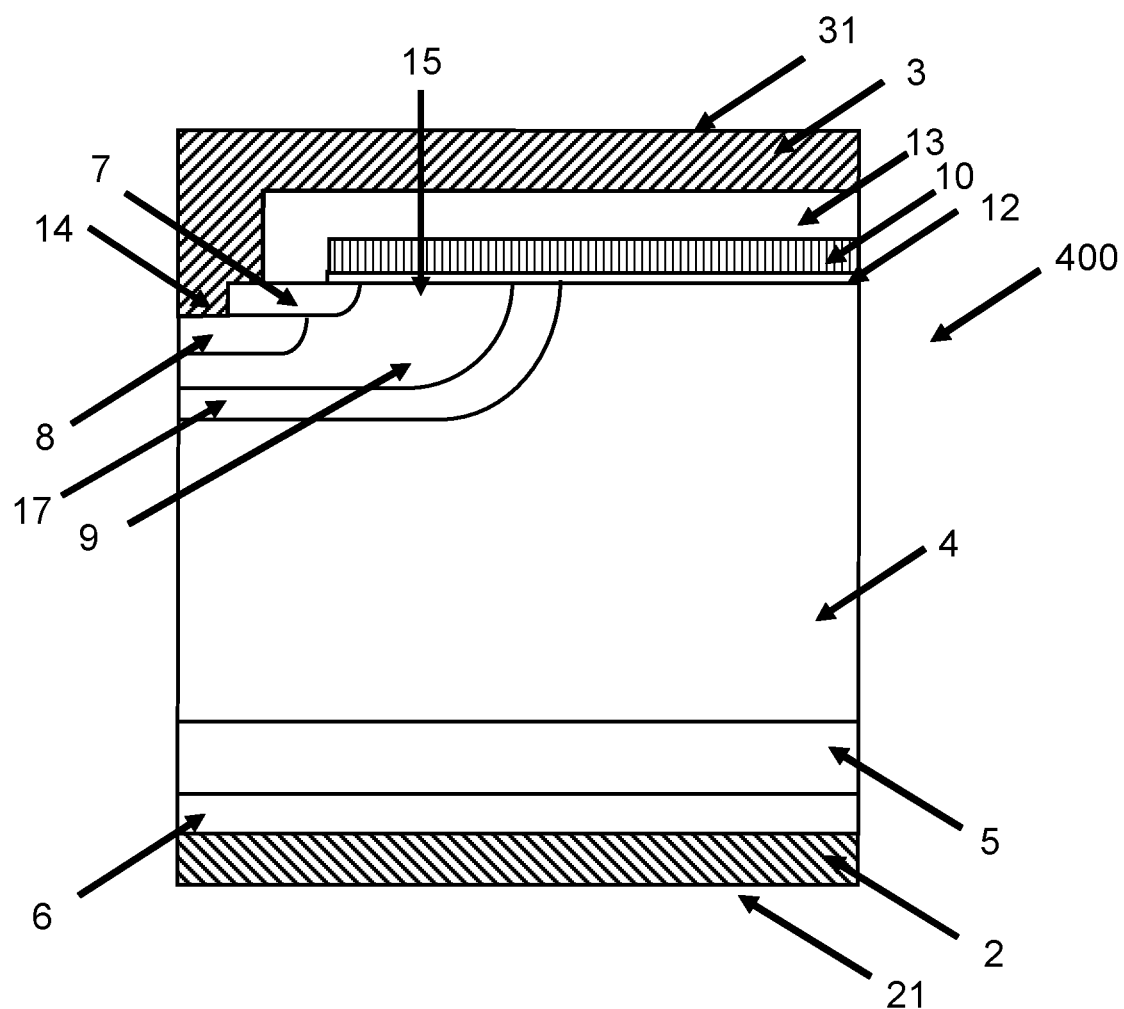
Figure 18A:
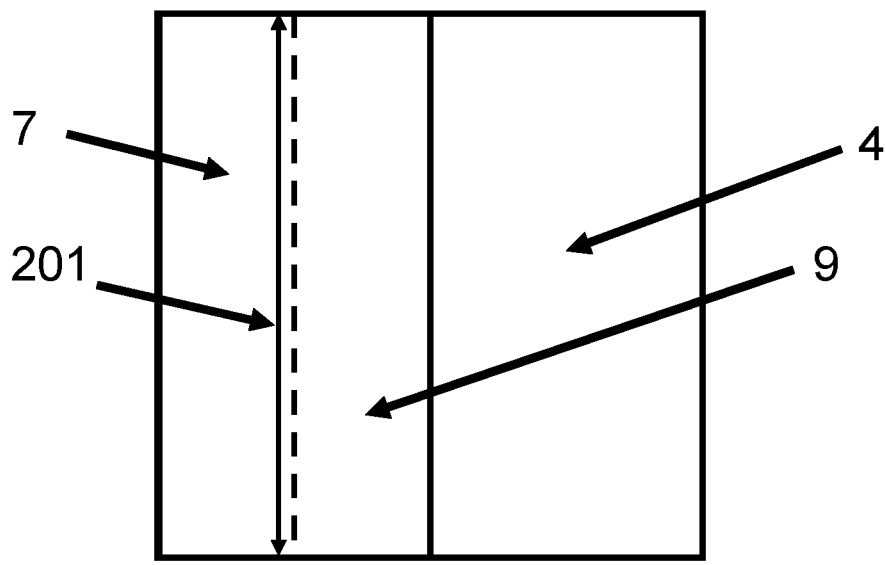
FIG. 18A: shows a top view of a transistor cell with stripe design, and the corresponding MOS channel width.
Figure 18B:
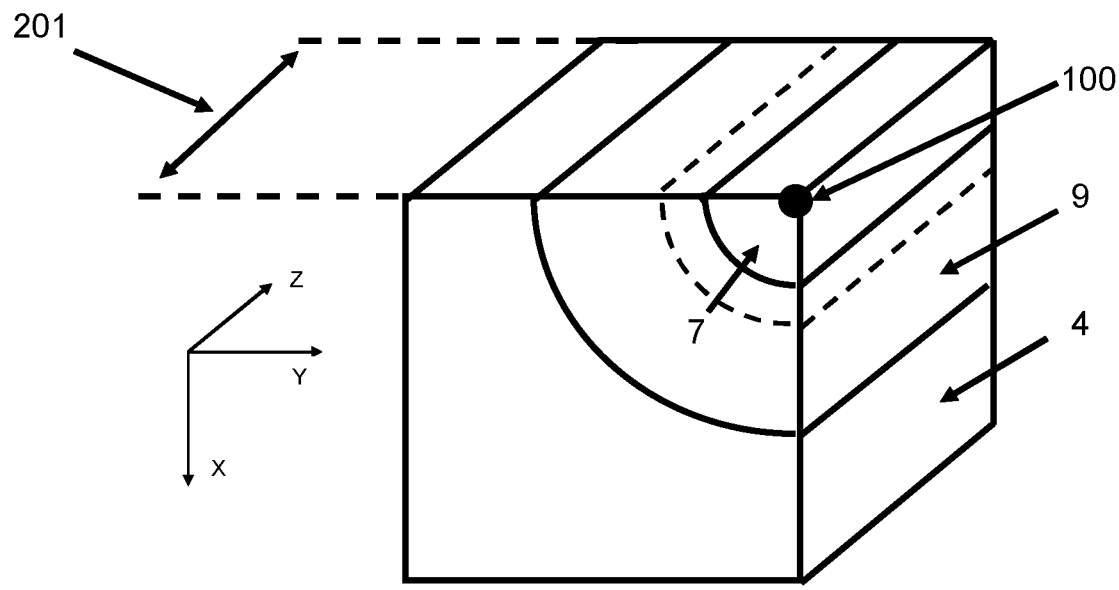
FIG. 18B: shows a three-dimensional representation of a transistor cell with stripe design, and the corresponding MOS channel width.

For planar type transistor cells as depicted in FIG. 1A with a linear design, the width 201 of the MOS channel can be defined simply as the longitudinal extension length of the source region 7 in the third dimension. This is better shown in FIG. 18A depicting a top view of a standard planar stripe transistor cell, or in FIG. 18B depicting a three-dimensional representation of the same cell, outlining more specifically the singular point 100, and the MOS channel width 201.

Figure 18C:
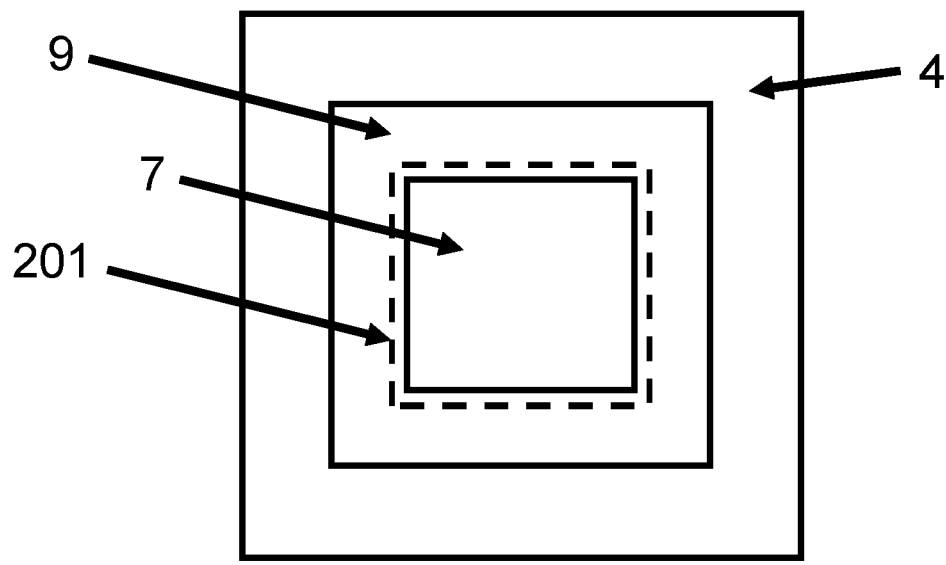
FIG. 18C: shows a top view of planar transistor cell with cellular design, and the corresponding MOS channel width.
Figure 18D:
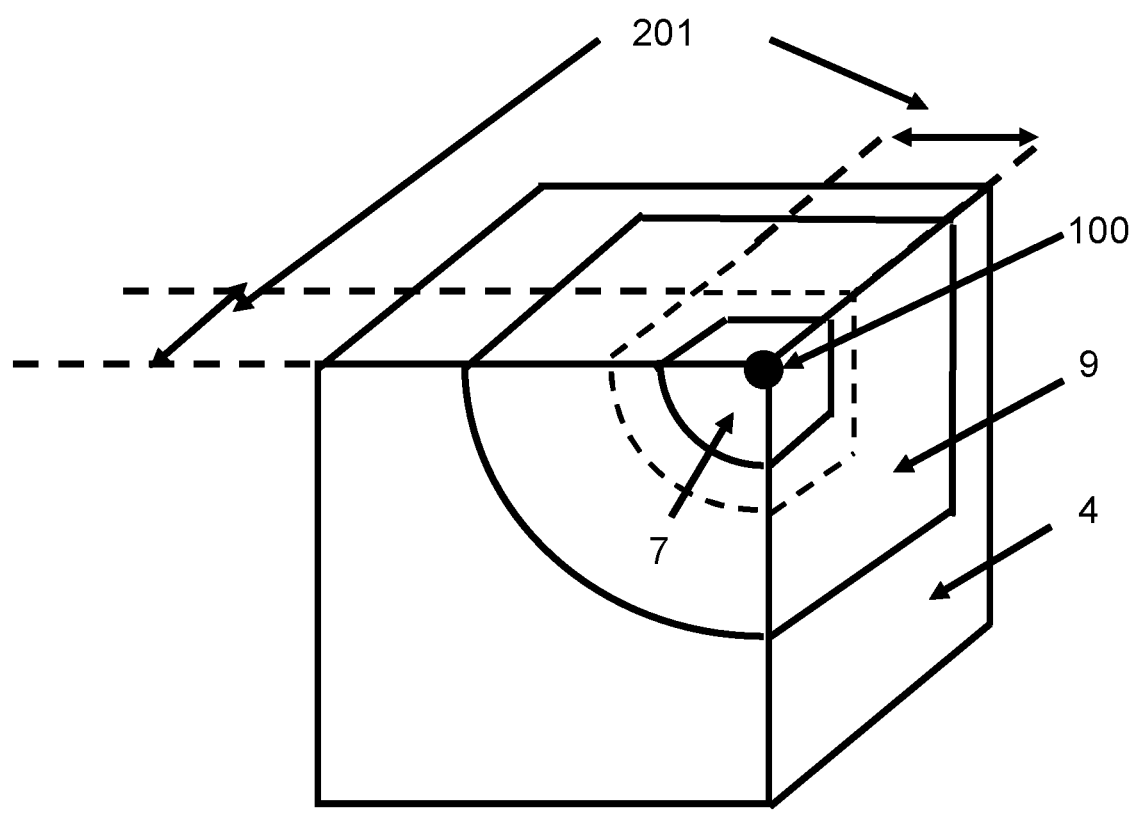
FIG. 18D: shows a three-dimensional representation of a planar transistor cell with cellular design, and the corresponding MOS channel width.

FIG. 18C shows a top view of a standard planar transistor with cell design, while FIG. 18D shows a three-dimensional representation of the same cell by taking into account the symmetry of the cell. The MOS channel width 201 is the same as the contour 201 representing the location of the maximum surface dopant concentration points in the first base layer 9.

Figure 2A:
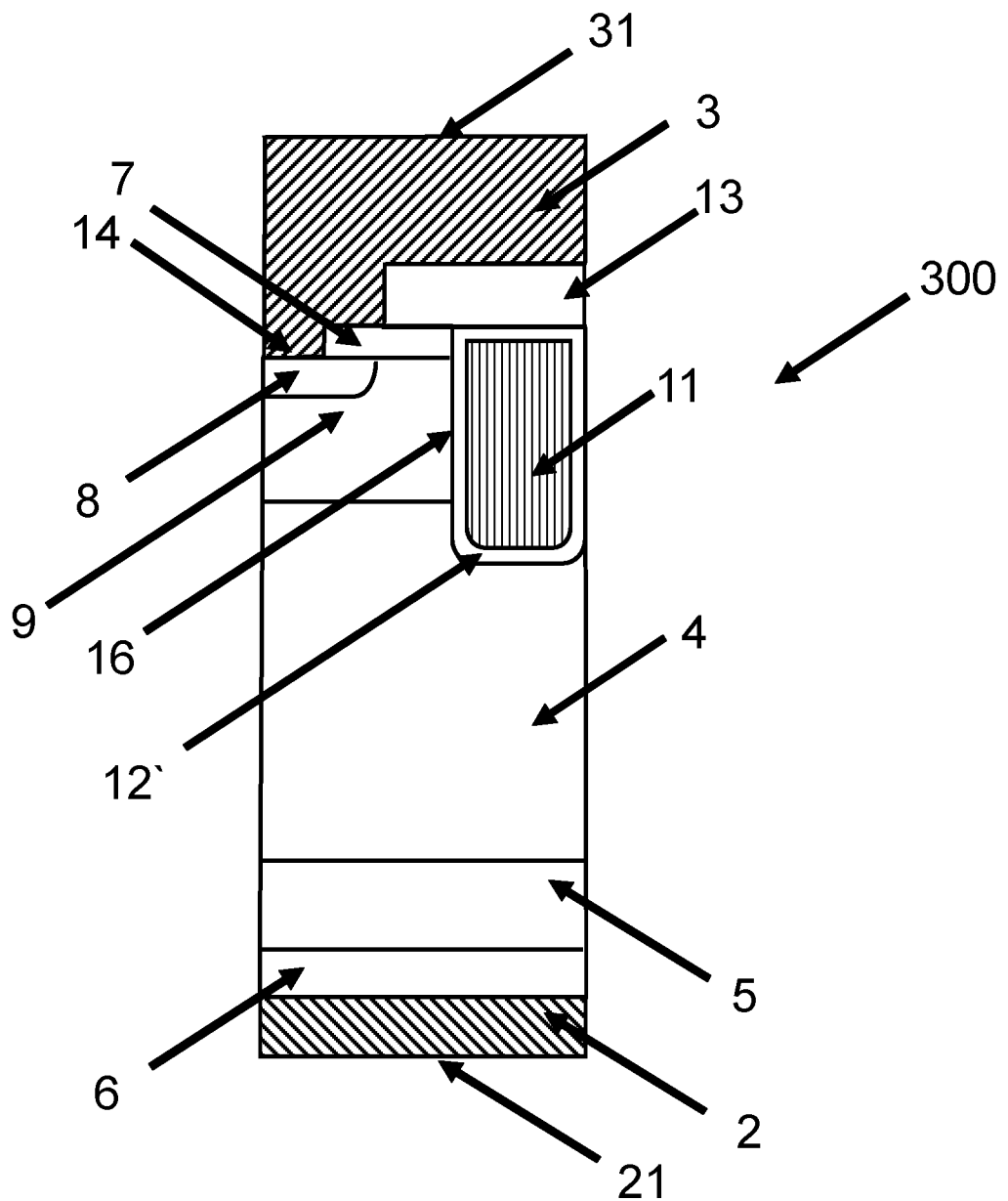
FIG. 2A-B: show the cross sections of Trench MOS IGBT structures (prior art).
Figure 19:
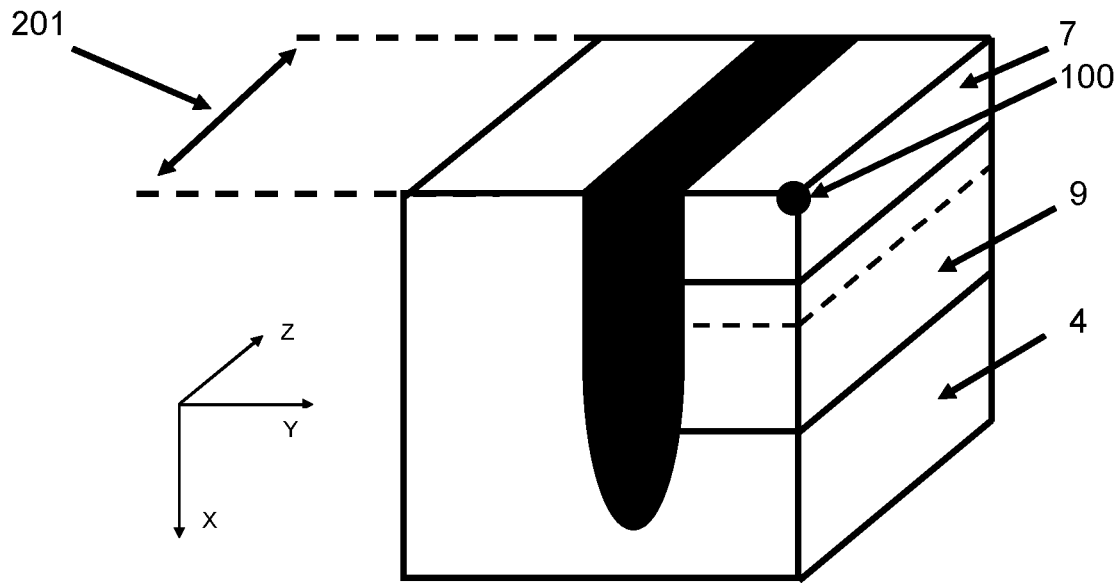
FIG. 19: shows a three-dimensional representation of a trench transistor cell with stripe design, and the corresponding MOS channel width.

FIG. 19 shows a three-dimensional representation of a trench transistor cell with stripe design. In cross section, such a structure is identical to FIG. 2A. In this case, the width 201 of the MOS channel can be defined simply as the longitudinal extension length of the source region 7 in the third dimension.

The total MOS channel width of a given full device comprising a plurality of transistor cells will be the sum of all the channel widths 201 of individual transistor cells.

In the first exemplary embodiment, a control voltage applied on the first gate electrodes 11 controls the formation of an inversion channel in the first base layer 9. If a positive voltage is applied with a value above a threshold value, an inversion channel is formed on the active lateral trench walls 40, except in the regions abutting the highly doped second base layer 8, which have higher dopant concentration. No surface inversion layer is formed on the emitter side 31 of the first base layer 9.

This aspect represents a paradigm shift in the design and functionality of power semiconductors, as it changes the rules known to, and used by, the experts in the field, in relation to MOS channel sizing and its operation.

Figure 6A:
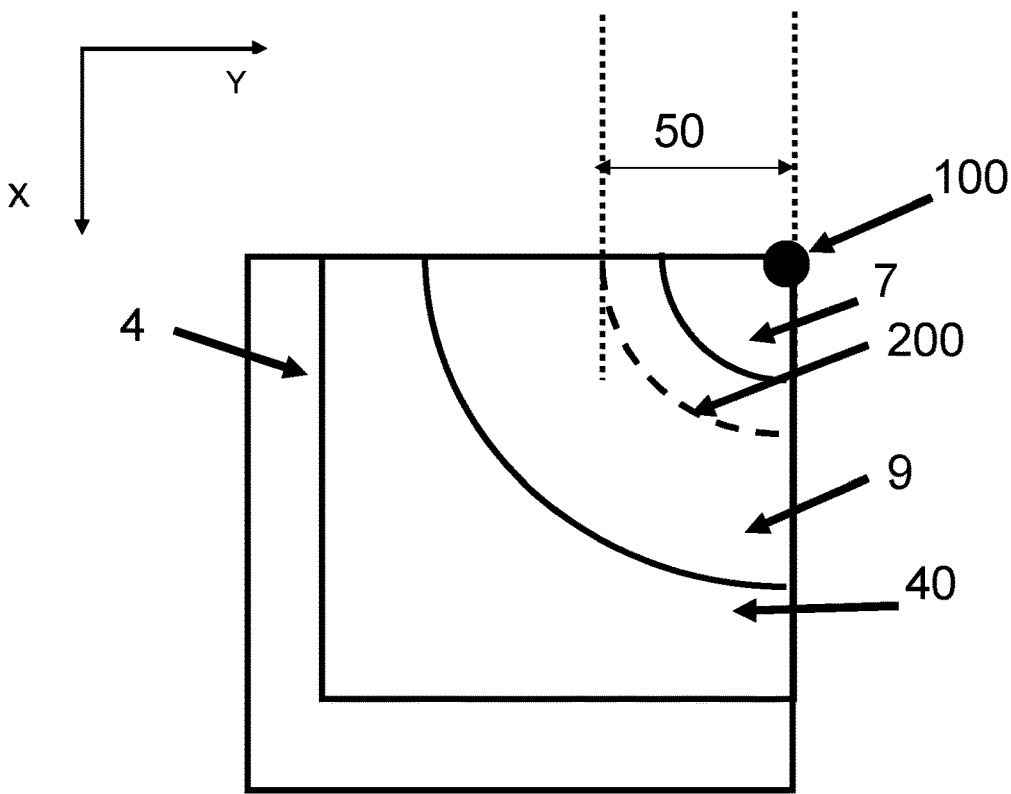
FIG. 6A: shows the MOS channel of the first example embodiment along a lateral trench wall
Figure 6B:
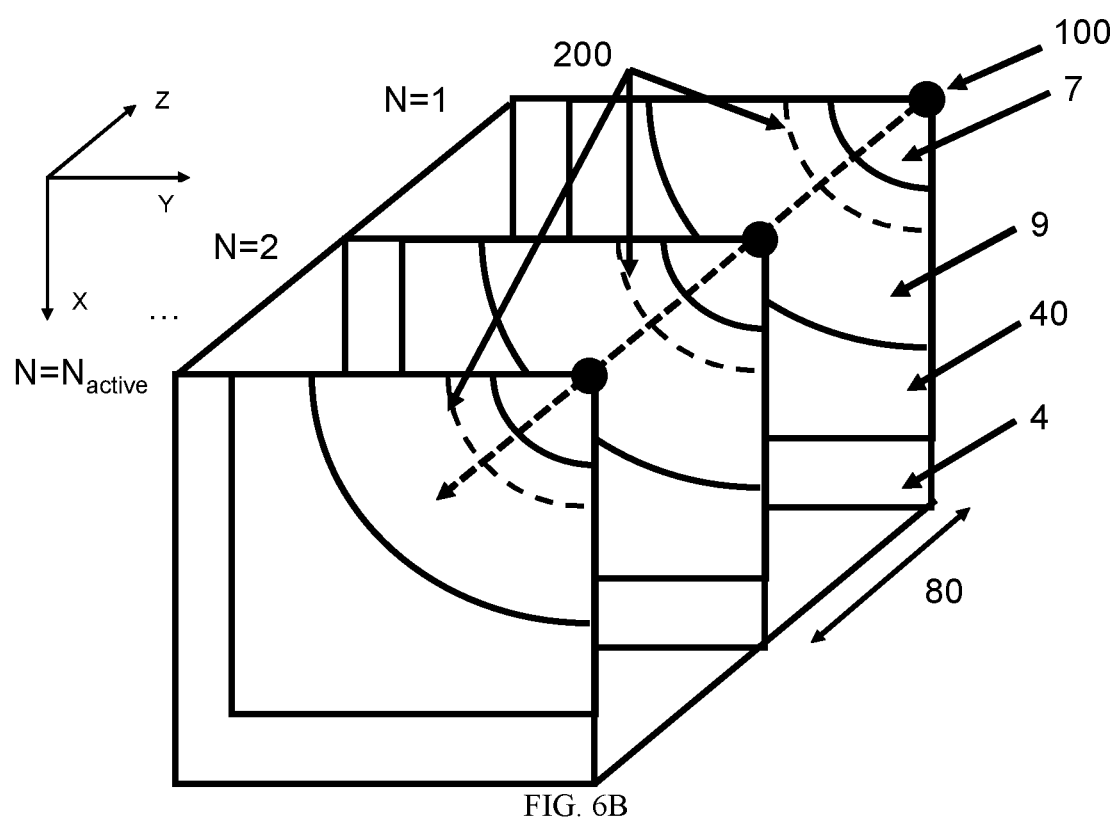
FIG. 6B: shows the total MOS channel for the first example embodiment at transistor cell level, comprising a plurality of lateral trench walls

The effective width of the MOS channel can be better understood by referencing to the zoomed-in transistor cell details in FIG. 4D and FIG. 6A. In conduction mode, the electron charge carriers are injected from the source region 7 in the inversion layer formed on the active lateral trench walls 40. The cell MOS channel width 200 is more accurately defined as a segment of a circle or a quadrant with the center at the singular point 100, and a radius equal to the length $L_{50}$ of the first separation region 50. This is slightly larger than the outermost peripheral distance of the n source region 7. The region 50 can be between 0.3-1 µm wide, and can be precisely controlled by the use of implantation masks for the source region 7, and the first base layer 9.

The single cell MOS channel width $W_{cell}$ can thus be approximated as the length of a quadrant section of a circle centered at the single point 100 with a radius $L_{50}$. Eq. (1) can be thus written as:

$$W_{cell} = \pi \times L_{50}/2 \qquad (1)$$

A fully functional power semiconductor device comprises a plurality of transistor cells 1 with a plurality of MOS channel widths 200, as shown in FIG. 6B. Thus, the total effective channel width $W_{total1}$ can be expressed as Eq. (2):

$$W_{total1} = N_{active} \times \pi \times L_{50}/2 \qquad (2),$$

where $N_{active}$ represents the total number of active lateral trench walls 40 over the entire device area, and $L_{50}$ is the length of the separation region 50. A typical power semiconductor device may have more than 10,000 active trenches in its structure.

The power semiconductor device according to the first exemplary embodiment further comprises a p-doped collector layer 6 arranged between a buffer layer 5 and the collector electrode 2, which collector layer 6 is in direct electrical contact to the collector electrode 2. An n-doped buffer layer 5 is arranged between the collector layer 6 and the drift region 4. A third insulation layer 13 is arranged between the emitter electrode 3 and the first gate electrodes 11.

The emitter electrode 3 and the insulating layer 13 are omitted in FIG. 3 to better facilitate the visualisation of the underlaying structures.

The simulation results performed using the first exemplary embodiment transistor cell showed that the on-state characteristics of the power semiconductor does not differ significantly compared to the results obtained with the prior art. However, because a planar gate electrode is omitted, the capacitances are reduced significantly, which in turn lowers the switching losses, and improves the controllability of the power semiconductor.

Figure 7A:
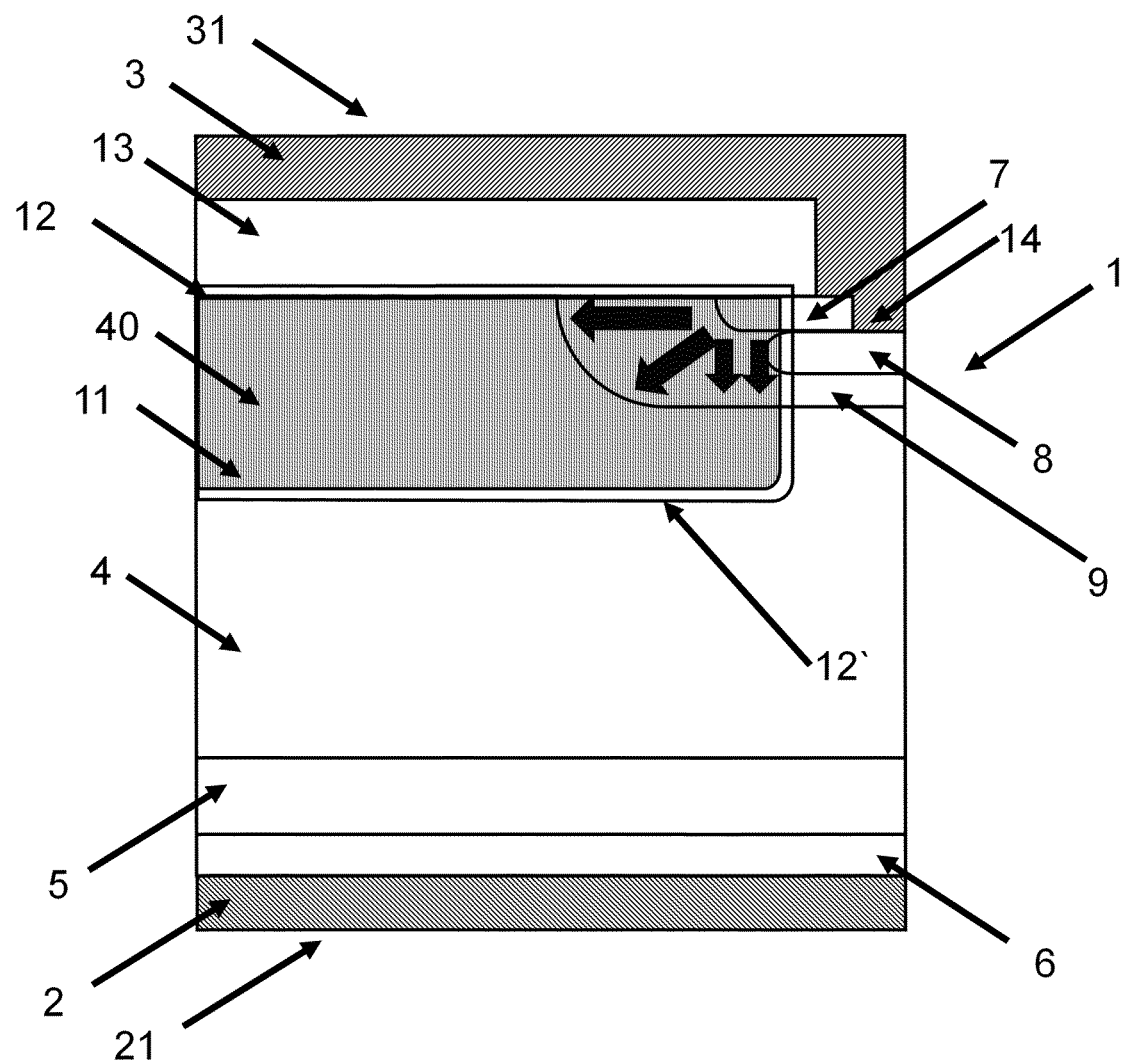
FIG. 7A-B: show a cross section, and a zoomed-in detail the second example embodiment of a transistor cell according to the invention.
Figure 7B:
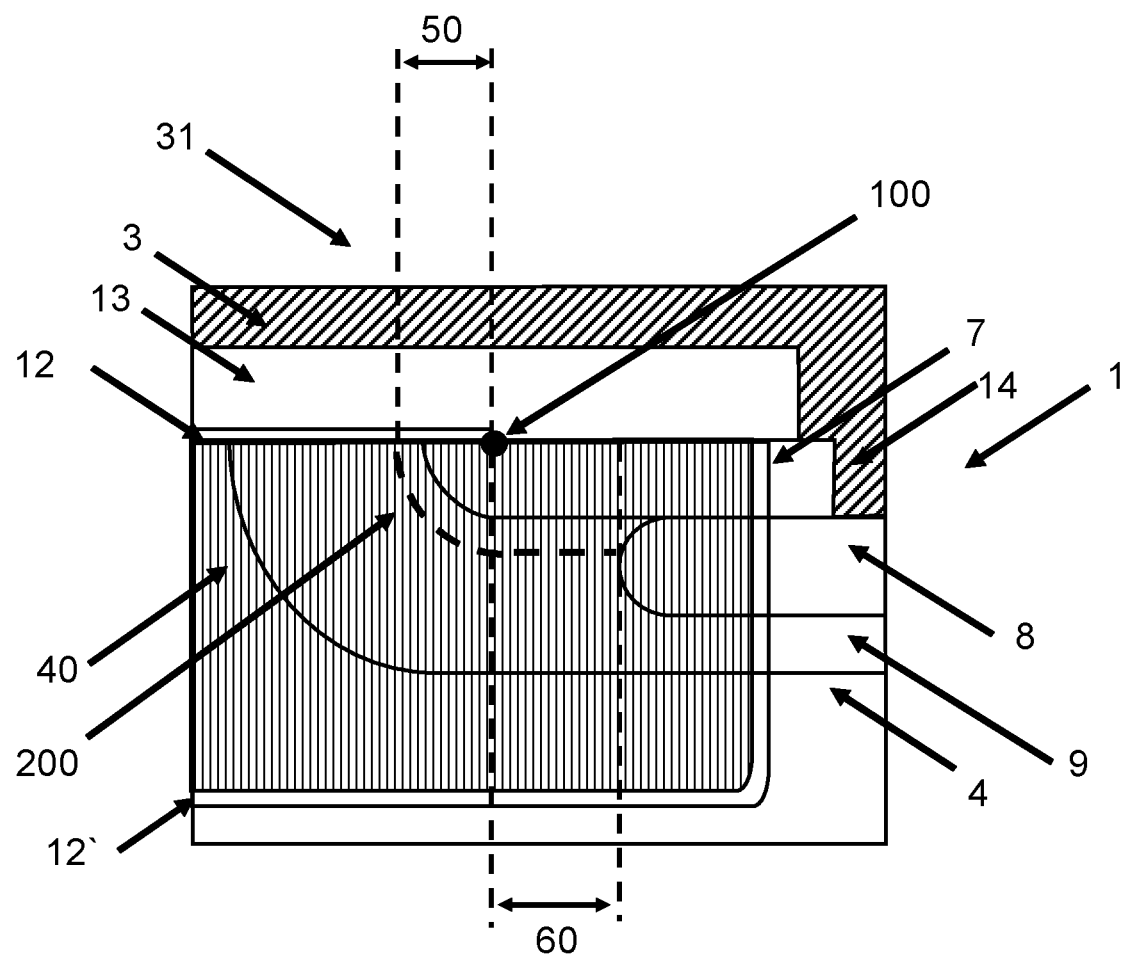

In a second exemplary embodiment shown in FIG. 7A, the first end of the second base layer 8 is not closely aligned in the second dimension with the singular point 100. A second separation region 60 with a length $L_{60}$ different than zero spaces apart the first end of the second base layer 8 from the singular point 100. As explained previously, this distance can be negative or positive. When $L_{60}$ is positive, it means that the second base layer 8 does not fully protect the bottom side of the source region 7. In the second embodiment, the trench regions abuts the second base layer 8. In a similar manner to the first exemplary embodiment, an inversion layer can be formed on the lateral trench walls 40 except in the regions where the trench abuts the highly doped second base layer 8. With reference to the zoomed-in detail in FIG. 7B, the effective MOS channel width for a full device can be expressed in this case by Eq. (3):

$$W_{total2} = N_{active} \times \left( \pi \times \frac{L_{50}}{2} + L_{60} \right) \qquad (3)$$

When the length of the separation region 60 is greater than 0, the effective channel width is greater than in the first embodiment case defined by Eq. (1). However, when the length of the separation region 60 is greater than 0, the highly doped second base layer 8 does not fully protect the bottom side of the source region 7, which may create issues with the Reverse Blocking Safe Operating Area (RB-SOA), i.e. the source region 7 may become locally forward biased and may inject electron charge carriers leading to a latch up phenomena.

Figure 2B:
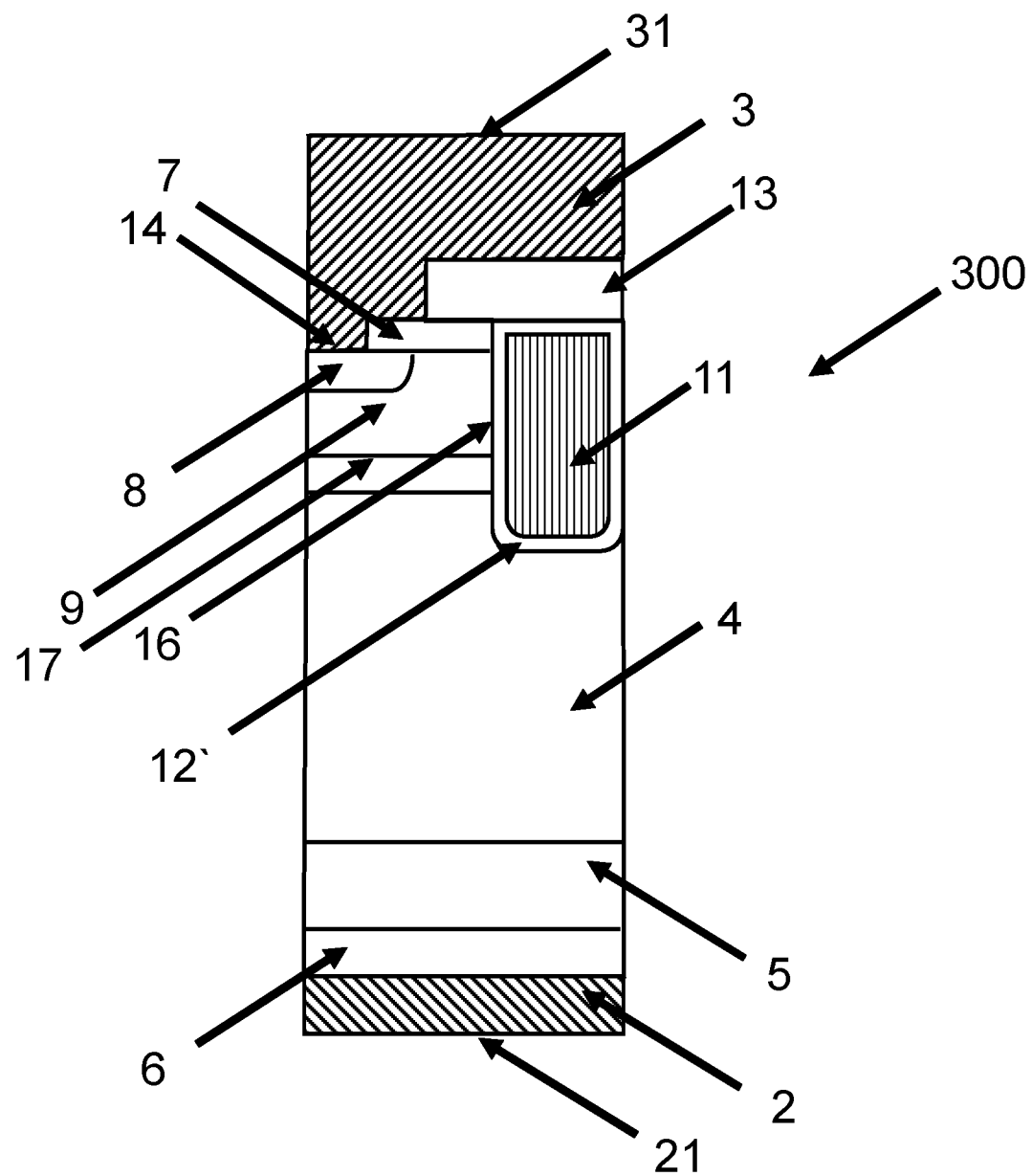
Figure 8A:
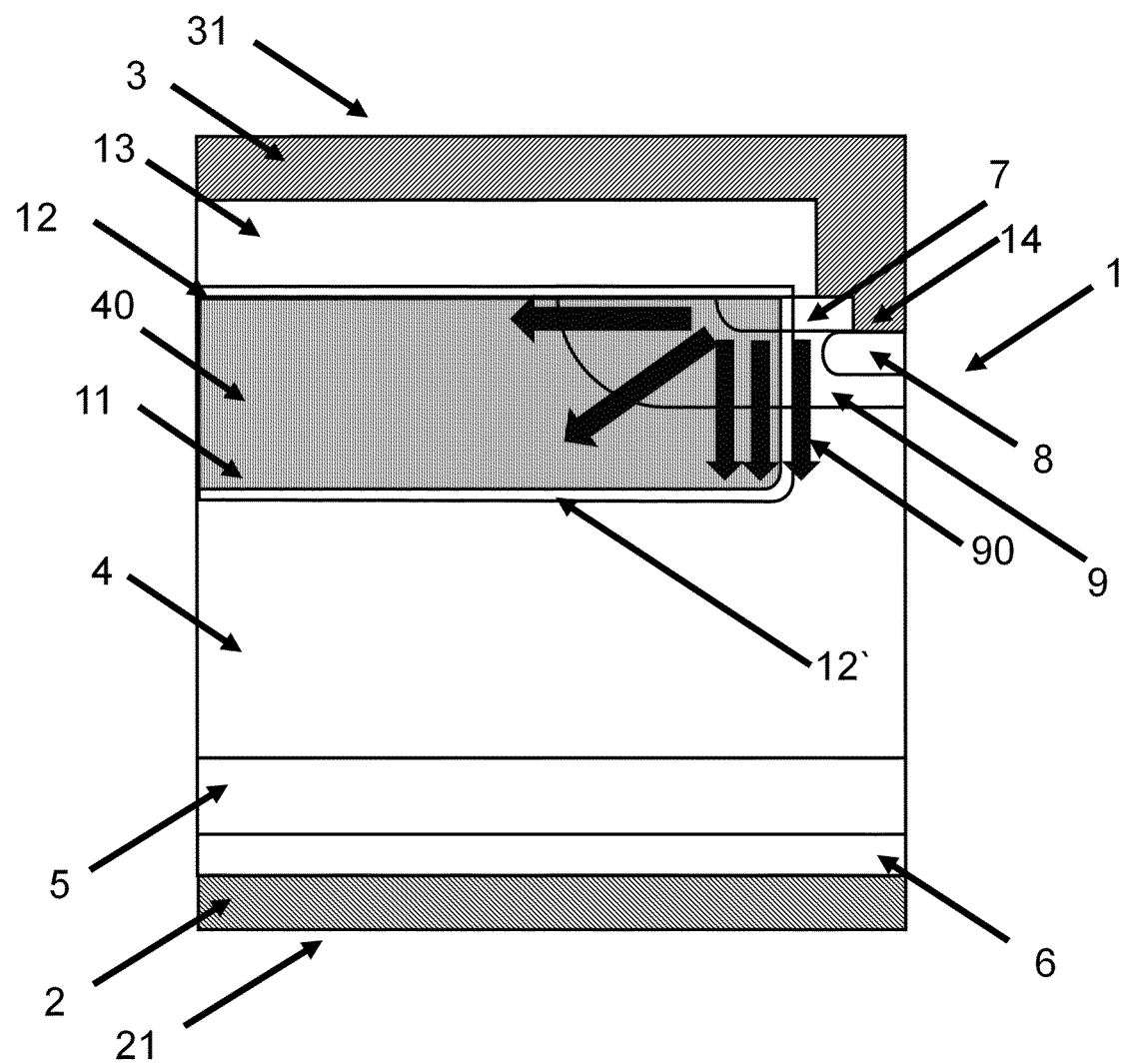
FIG. 8A-B: show a cross section and a zoomed-in detail of the third example embodiment of a transistor cell according to the invention.
Figure 8B:
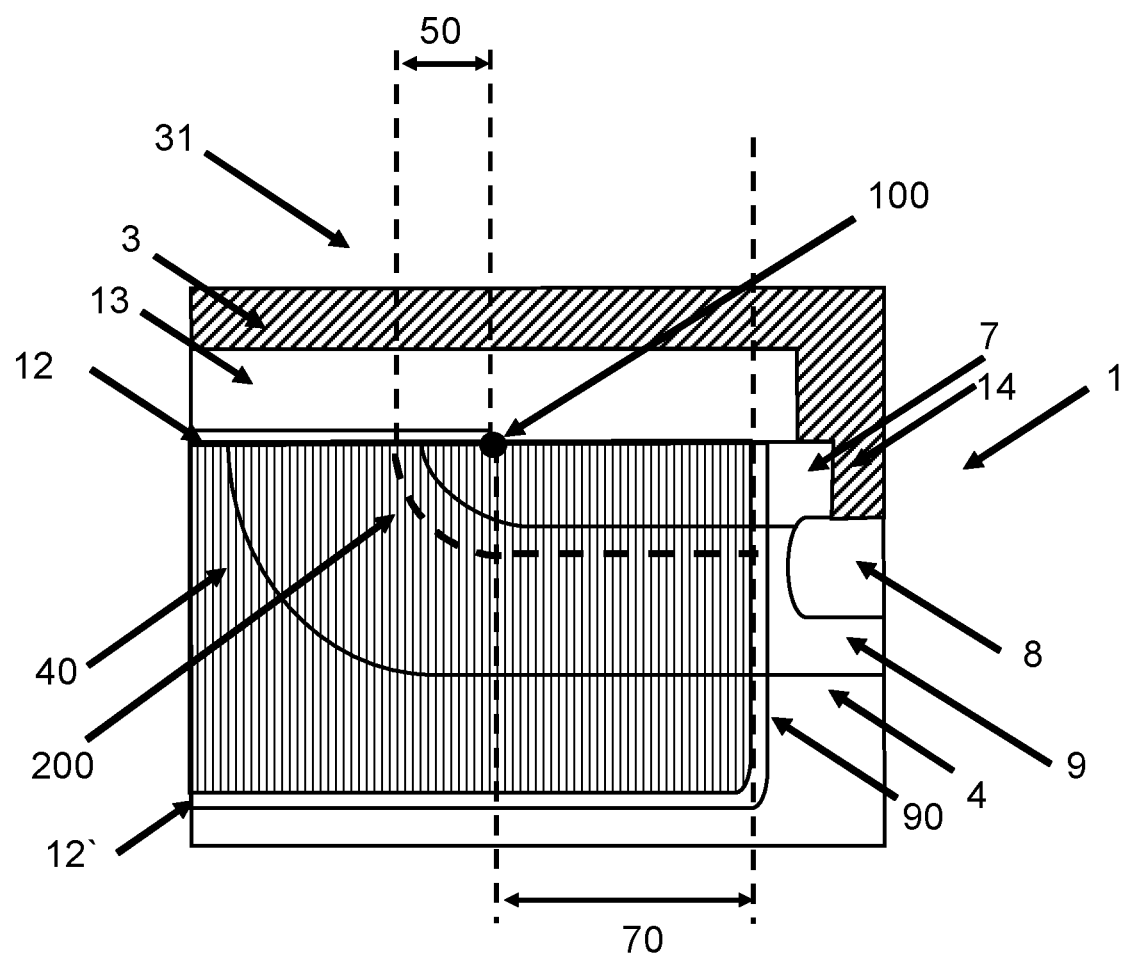

In a third exemplary embodiment shown in FIG. 8A, the trench regions do not abut the second base layer 8. In this case, when a positive gate voltage is applied on the second gate electrodes 11, an inversion layer can form on the two lateral walls 40 and on the first end wall 90 of the trench regions in contact with the first base layer 9. The channel on the end wall 90 will be similar to a vertical MOS channel as schematically shown in FIG. 2. With reference to the zoomed-in image in FIG. 8B, the effective MOS channel width can be expressed by Eq. (4):

$$W_{total3} = N_{active} \times \left( \pi \times \frac{L_{50}}{2} + L_{70} \right) + N^Z_{active} \times L_{80}, \qquad (4)$$

where, in addition to the parameters already defined above, $L_{70}$ is the length of the region 70 that separates in the second dimension the singular point 100 from the first end wall of an adjacent trench region, $L_{80}$ is the width of a trench region in the third dimension, and $N^Z_{active}$ is the number of active end trench walls across the plurality of transistor cells.

It can be noticed that $W_{total3} \gg W_{total1}$, which means that the third embodiment describes power semiconductor devices with reduced on-state losses compared to the first embodiment. However, there may be trade-off considerations to be taken into account, for example a weaker short circuit capability, or reduced immunity against latch-up phenomena, or increased internal capacitances. The proposed concepts provide a large degree of flexibility in selecting various design parameters towards achieving the best possible trade-off.

Figure 9:
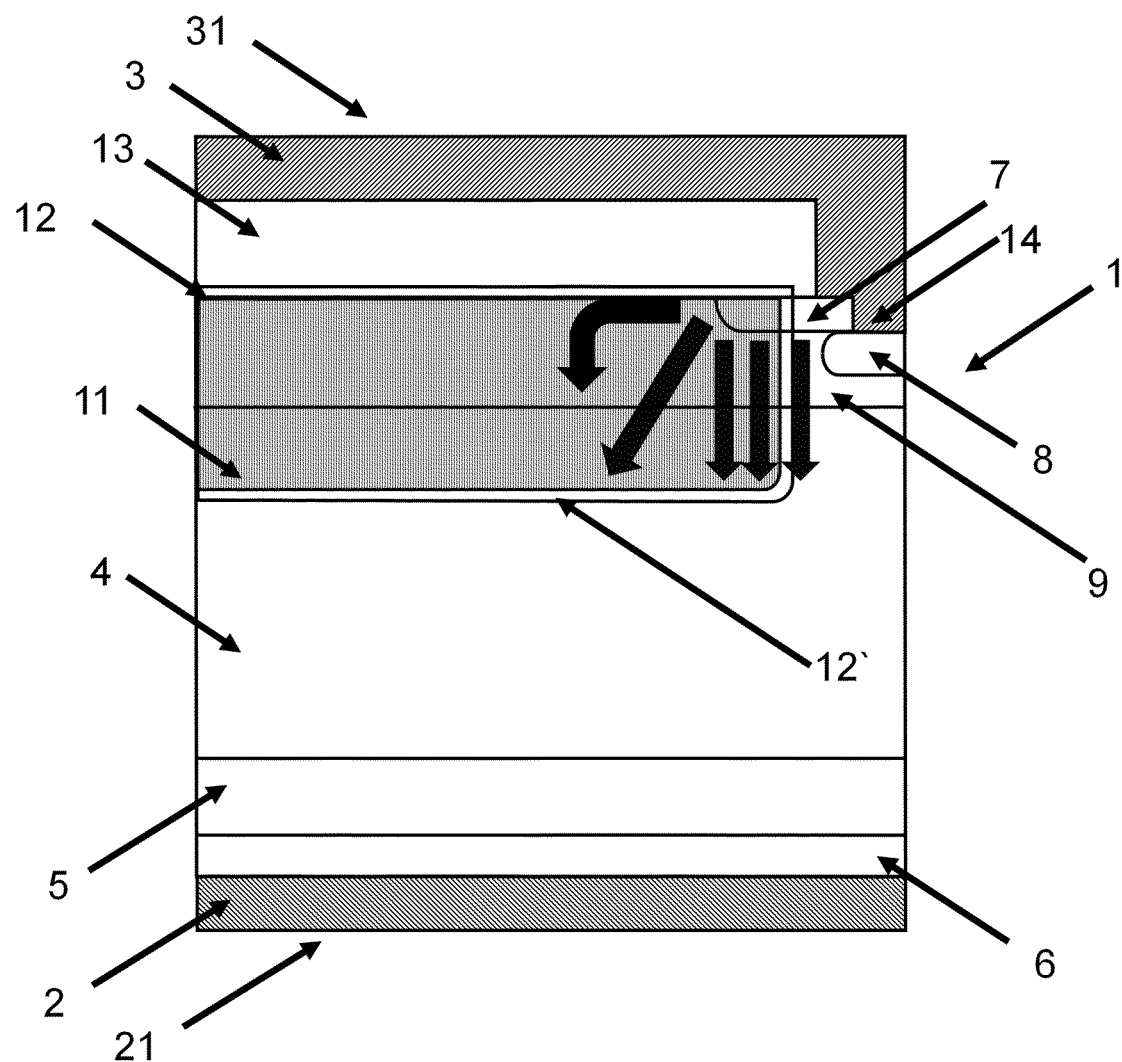
FIG. 9: shows a cross section of the fourth example embodiment of a transistor cell according to the invention.

In the first exemplary embodiment, the drift layer 4 is in direct contact with the third insulation layer 13 on the emitter side 31 in the region beyond the first end of the first base layer 9. However, in a fourth exemplary embodiment shown in FIG. 9, the first base layer 9 extends uniformly over the drift layer 4, and therefore the drift layer 4 is not in direct contact with the third insulation layer 13.

Figure 10:
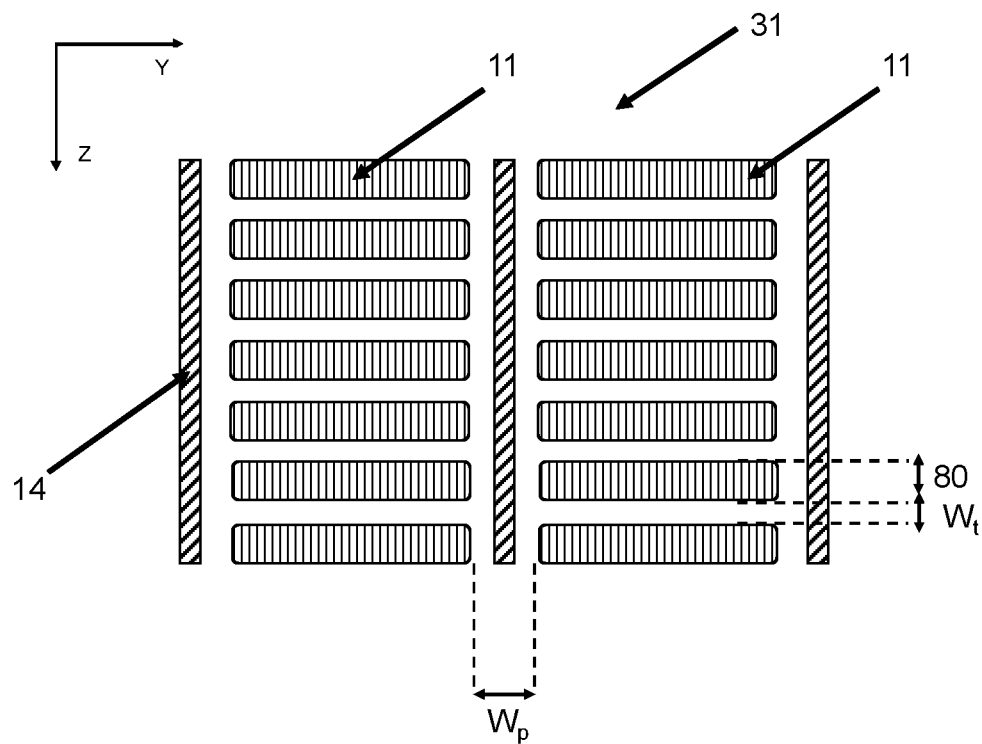
FIG. 10: shows a top view of multiple transistor cells according to the first example embodiment of the invention to help define key geometrical parameters.

With respect to the FIG. 10 showing a top view of multiple transistor cells according to the first embodiment, the critical design aspects are the dimension $W_t$ or mesa between the trenches in the Z direction, as well as the dimension $W_p$ representing the distance from the end of one trench to the adjacent trench in the Y direction. Improved carrier storage/reduced hole drainage is expected as the dimensions $W_t$ and $W_p$ are reduced. The value of $W_t$ may be in a range from about 5 µm to below 0.1 µm, more preferably from 1 µm to 0.1 µm—which is achievable with the proposed design because no additional structures have to be lithographically defined in between the trenches. Also, improved carrier storage/reduced hole drainage is expected reducing the distance $W_p$ by etching the adjacent trenches closer to each other in the Y direction. More specifically, $W_p$ could extend approximately in a range from about 20 µm to about 1 µm, preferably from 5 µm to 1 µm, and more preferably from 2 µm to 1 µm.

Figure 11:
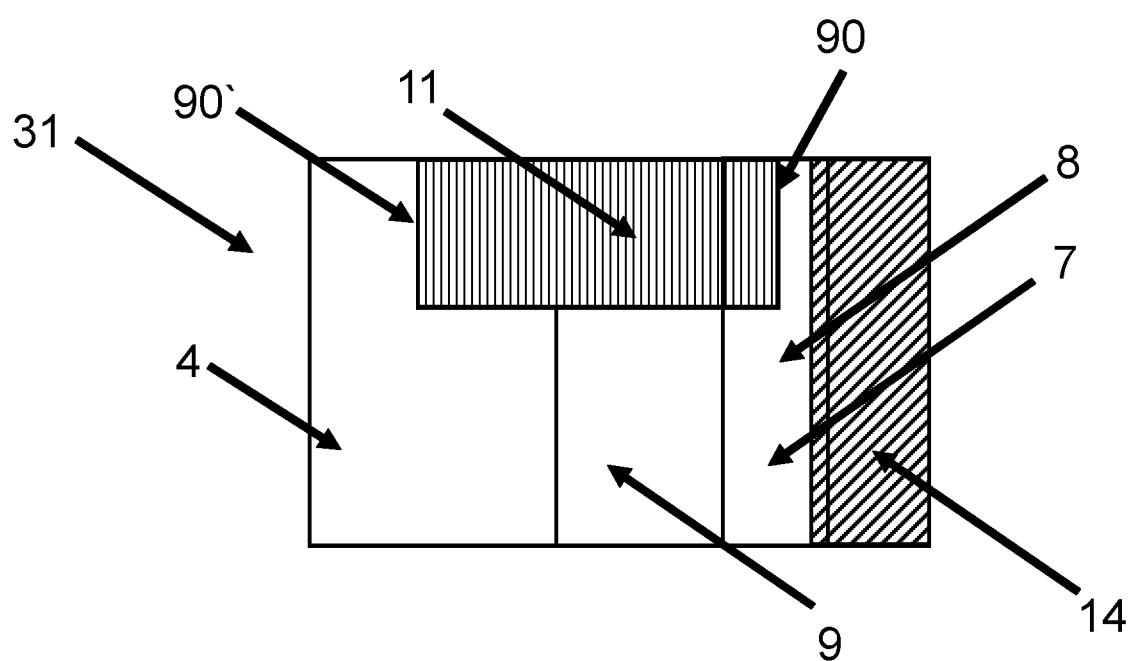
FIG. 11: shows a top view of the fifth example embodiment of a transistor cell according to the invention.

FIG. 11 shows a top view of a fifth exemplary embodiment of a power semiconductor transistor cell 1, wherein the trench regions embedding the second gate electrodes 11 are shorter in the Y direction, so that the first end wall 90 is arranged in the source region, and the second end wall 90' is arranged in the drift layer 4. This arrangement will effectively reduce the capacitance associated with the plurality of first gate electrodes 11.

Figure 12:
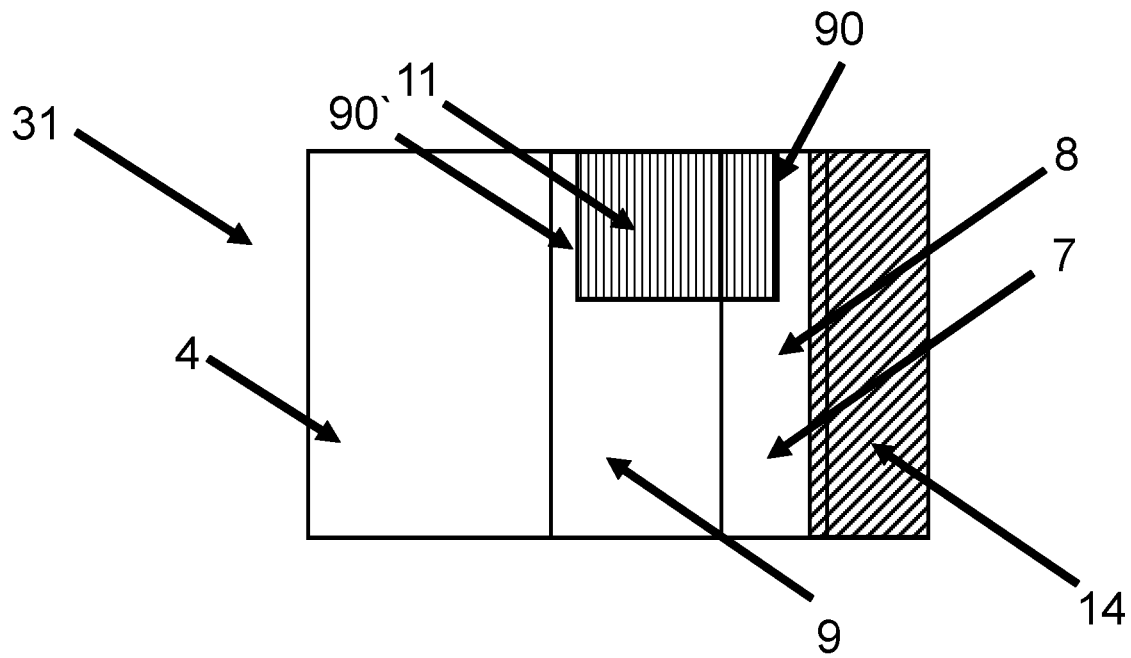
FIG. 12: shows a top view of the sixth example embodiment of a transistor cell according to the invention.

FIG. 12 shows a top view of a sixth exemplary embodiment of a power semiconductor device 1, wherein the trench recesses are further shortened in the second dimension, such that the first end wall 90 is arranged in the source region 7, and the second end wall 90' is arranged in the first base layer 9.

Figure 13:
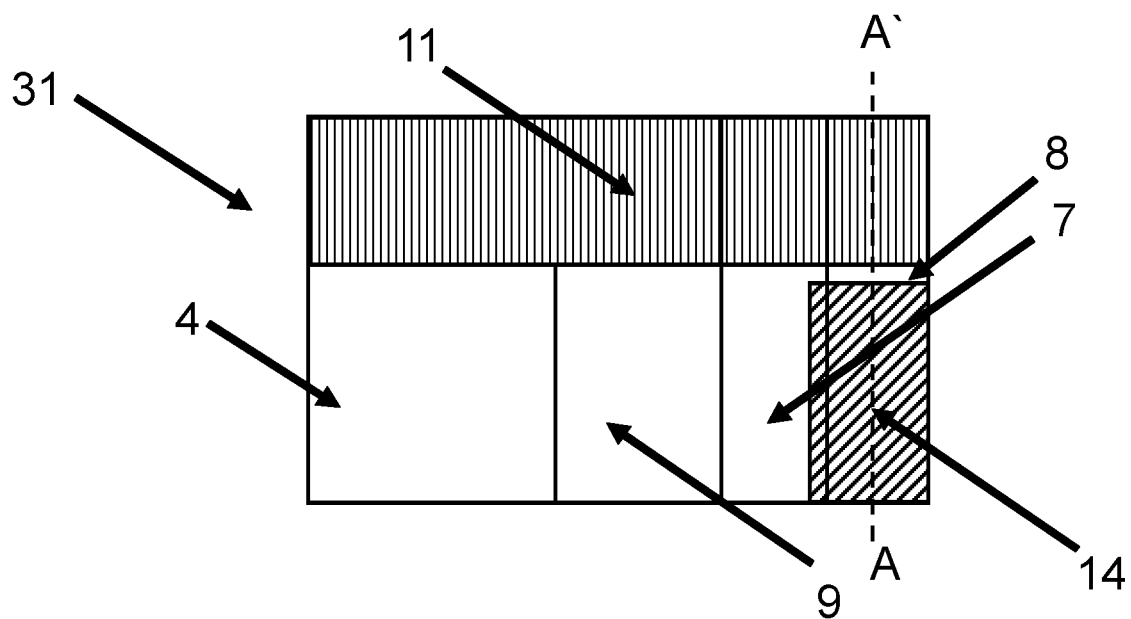
FIG. 13: shows a top view of the seventh example embodiment of a transistor cell according to the invention.

FIG. 13 shows a top view of a seventh exemplary embodiment, wherein the trench recesses extend in the Y direction crossing the source region 7, the first and the second base layers 8 and 9.

Figure 14:
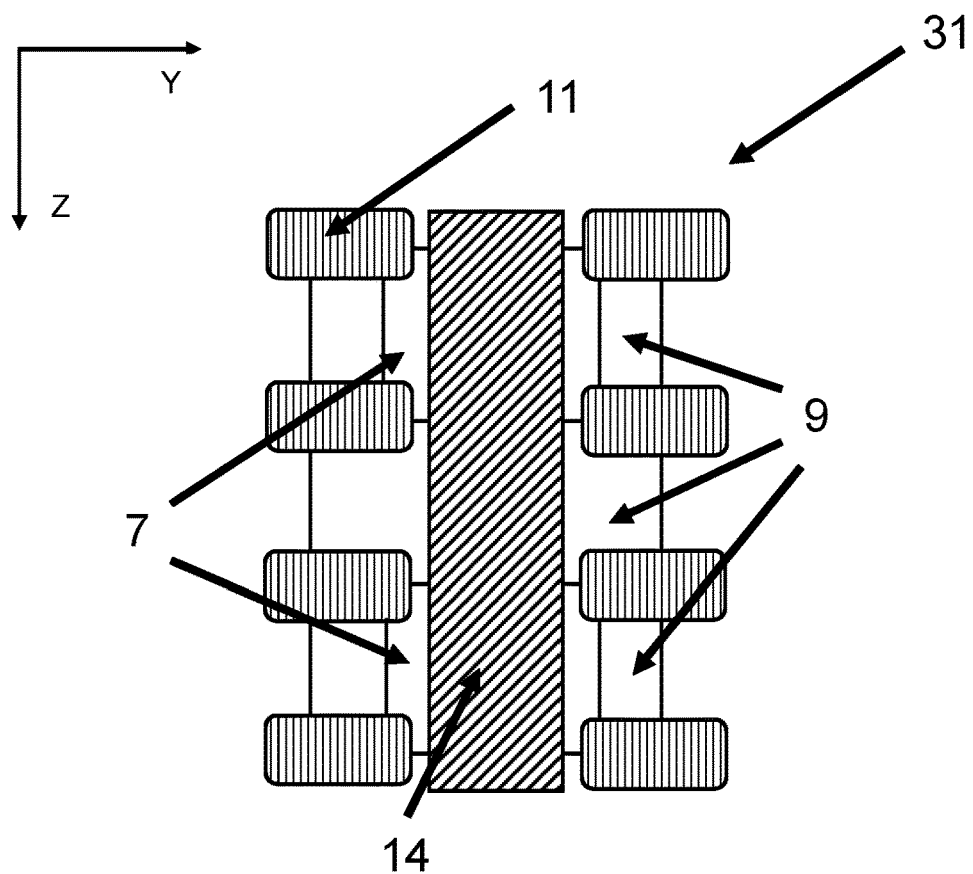
FIG. 14: shows a top view of the eighth example embodiment of a transistor cell according to the invention.

In order to address possible short circuit operating conditions, it may also be possible to structure the transistor cells 1 in such a manner that the source region 7 is omitted in between some adjacent trench regions. FIG. 14 shows an eighth exemplary embodiment of demonstrates a power semiconductor device with reduced total area of source region, which is expected to improve the resilience under short circuit conditions.

Figure 15:
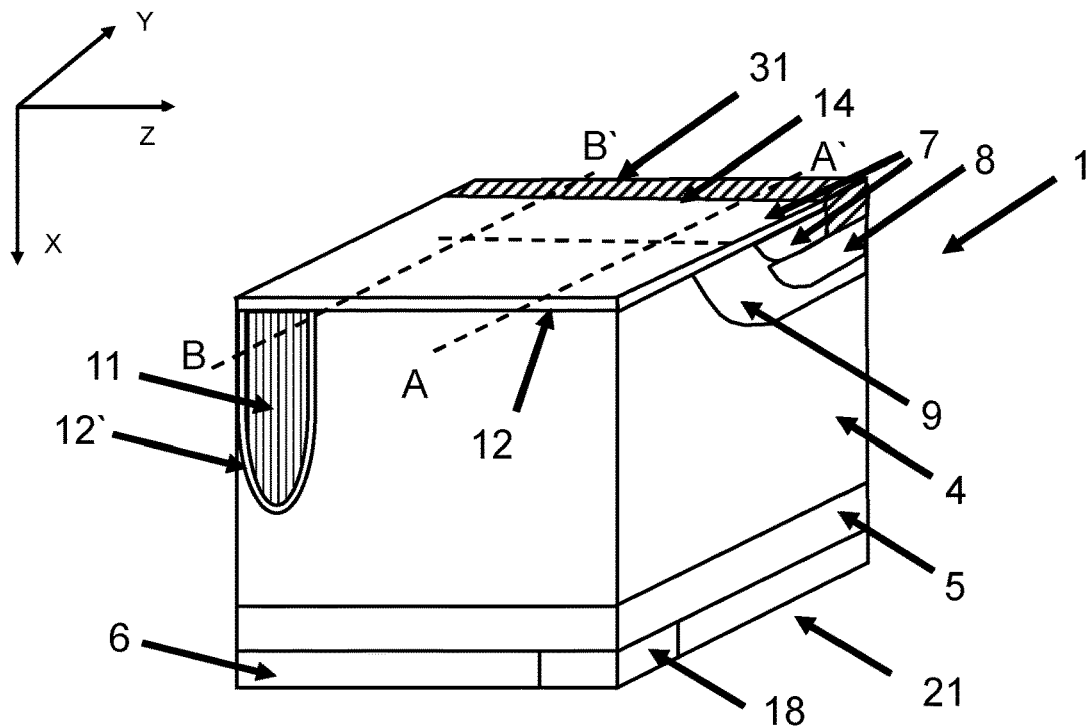
FIG. 15: shows a three-dimensional representation of the nineth example embodiment of a transistor cell according to the invention.

A ninth exemplary embodiment shown in FIG. 15, is a reverse conducting type of power semiconductor, wherein the collector layer may be formed of alternating regions of p doped 6 and n doped 18 semiconductor material. In this case, there will be a diode formed in parallel with the transistor in the same cell. The performance of the diode part will be heavily influenced by the emitter side structure of the transistor cell. With the embodiments disclosed in this patent application, it will be possible to better control the trade-off performance curves for the diode part, without negatively affecting the transistor part.

Figure 16:
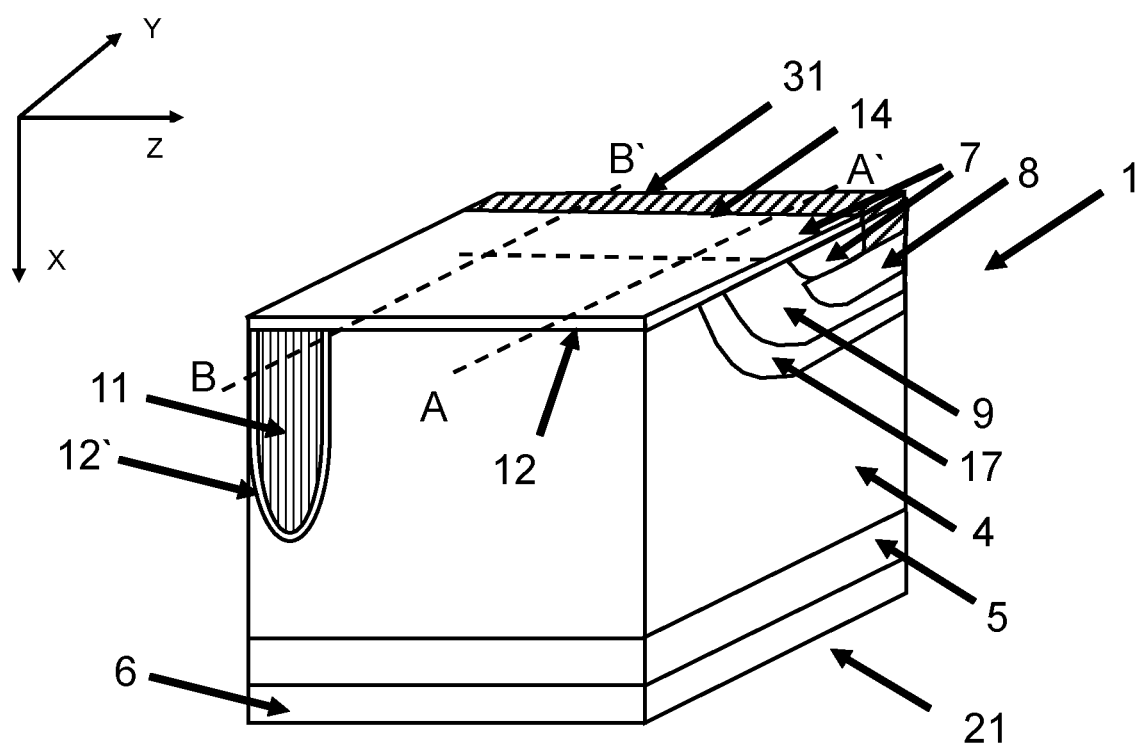
FIG. 16: shows a three-dimensional representation of the tenth example embodiment of a transistor cell according to the invention.

In a further tenth embodiment depicted in FIG. 16, an n doped enhancement layer 17 may be arranged between the drift layer 4 and the first base layer 9, with the purpose of further enhancing the plasma concentration at the emitter side. To achieve this effect, the doping of the layer 17 may be larger than the doping of the drift layer 4.

Figure 17A:
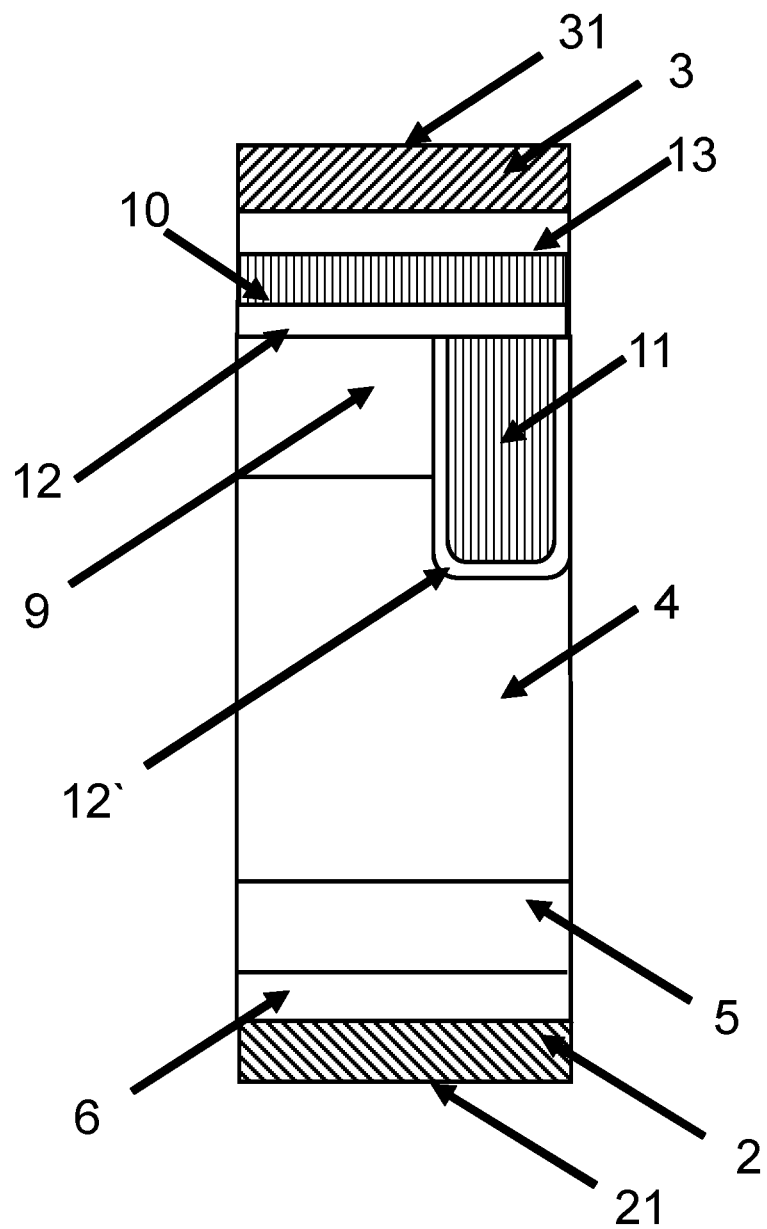
FIG. 17A-B: show cross sections of the eleventh example embodiment at certain cut lines.
Figure 17B:
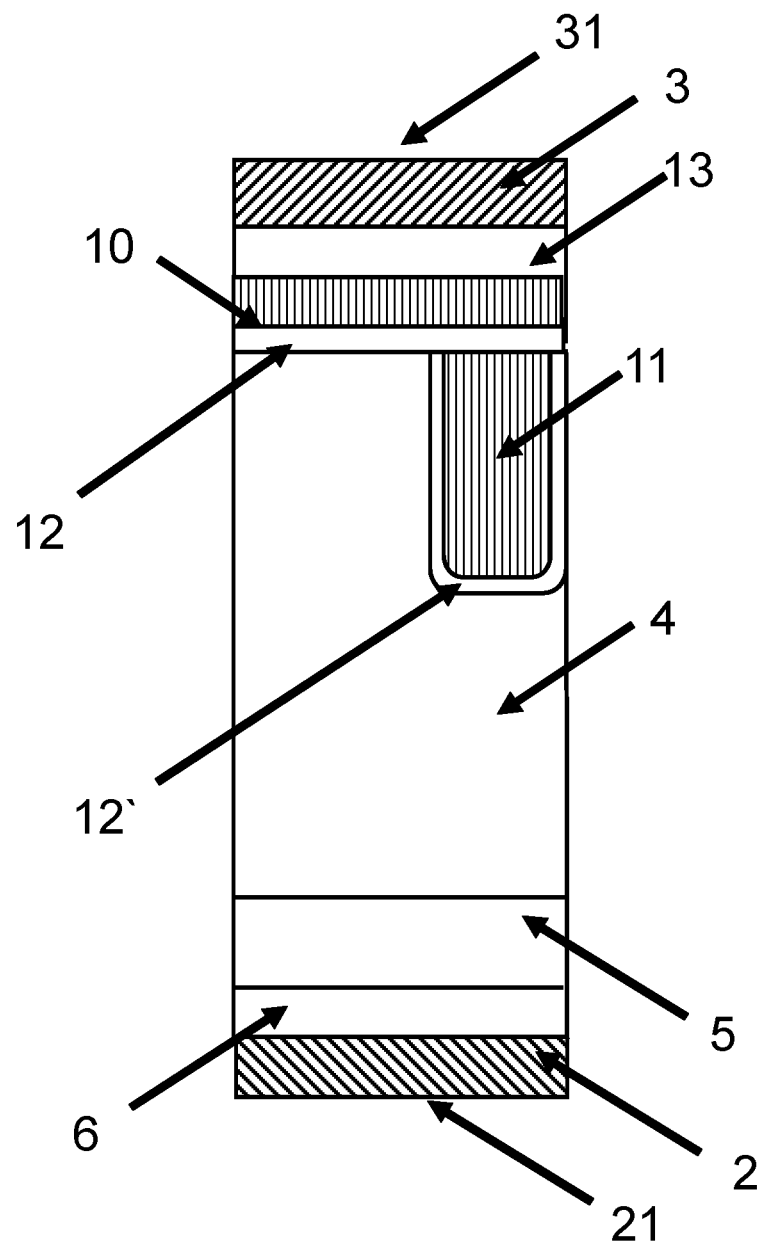

FIG. 17A-B show an eleventh exemplary embodiment of a power semiconductor device 1 at similar cut lines as D-D' and E-E' in FIG. 4A. The layers in the eleventh embodiment are arranged between an emitter electrode 3 on an emitter side 31 and a collector electrode 2 on a collector side 21, which is arranged opposite of the emitter side 31 in a first dimension. The IGBT transistor cell according to the eleventh embodiment comprises the following layers:

an (n-) doped drift layer 4, which is arranged between the emitter side 31 and the collector side 21, a p doped first base layer 9, which is arranged between the drift layer 4 and the emitter electrode 3, which first base layer 9 extends in a top view plane in a third dimension, an n doped source region 7, which is arranged at the emitter side 31 embedded into the first base layer 9 and contacting the emitter electrode 3, which source region 7 has a higher doping concentration than the drift layer 4, and which source region 7 extends in a top view plane in the third dimension, wherein the first end of the source region 7 is separated in a second dimension by a distance $L_{50}$ from the first end of the first base layer 9, a p doped second base layer 8, which is arranged between the first base layer 9 and the emitter electrode 3, which second base layer 8 is in direct electrical contact to the emitter electrode 3, which second base layer 8 has a higher doping concentration than the first base layer 9, which second base layer 8 extends in the first dimension deeper than the source region, and in a top plane view along the third dimension, a plurality of first gate electrodes 11 embedded in corresponding trench recesses, and electrically insulated from the first base layer 9, the second base layer 8, the source region 7 and the drift layer 4 by a first insulating layer 12', which first gate electrodes 11 extend longitudinally in the second dimension, and are arranged at an angle of 90 degrees with respect to the third dimension, when observed in a top view plane. The trench recesses intersect the source region 7, and may or may not intersect also the second base layer 8, and a second gate electrode 10, which is arranged on top of the drift layer 4 on the emitter side 31 and is electrically insulated from the first base layer 9, the source region 7 and the drift layer 4 by a second insulating layer 12, and from the emitter electrode 3 by a third insulating layer 13

The first gate electrodes 11 are electrically and physically disconnected from the second gate electrode 10 by the second insulating layer 12. One or more first gate electrodes 11 can be electrically connected with the emitter electrode 3, or be electrically floating (ie. not contacted)

Furthermore, a p doped collector layer 6 can be arranged between a buffer layer 5 and the collector electrode 2, and the collector layer 6 is in direct electrical contact with the collector electrode 2. The n doped buffer layer 5 is arranged between the collector layer 6 and the drift region 4.

A key feature of the eleventh embodiment is that the thickness of the second insulating layer 12 may be larger than the thickness of the first insulating layer 12'. When an electrical potential is applied to the second gate electrode 10, an inversion layer is prevented from forming at the emitter side 31 of the first base layer 9, under the second gate electrode 10. The first gate electrodes 11 will form an inversion layer on the lateral walls of the trench regions. Therefore, the correct operation of the power semiconductor is insured.

In this eleventh exemplary embodiment, the second gate electrode 10 may be grounded or left floating. Consequently, no inversion layer can be formed at the emitter side 31 of the first base layer 9, under the second gate electrode 10. Because there is no electrical connection to the first gate electrodes 11, the operation of the electrodes 11 remains independent from second gate electrodes 10, and follows the same phenomenon as a described previously, with the electrons flowing along the lateral walls of the trench regions when the potential of the gate electrode is greater than a threshold value.

In other embodiments, the material of the drift layer may be different than Silicon, for example it may be made of Silicon Carbide, Gallium Nitride, Gallium Oxide, Zinc Oxide or the like. In this case, the same embodiments as described above can be applied, however the specific dimensions and dopant profiles have to be adjusted accordingly by means known to those experts in the field. More specifically, if the drift layer is made of Silicon material, the trench regions may extend vertically to a depth approximately in a range from about 2 μm to about 7 μm. The trench width may range from about 3 μm to about 0.5 μm. However, if the drift layer comprises wide band gap materials such as Silicon Carbide or Gallium Nitride or Gallium Oxide or Zinc Oxide, the depth of the trench recesses can be also smaller than 2 μm.

In addition, for some of the additional embodiments comprising wide bandgap materials, the buffer layer 5 and the collector layer 6 may be omitted, in particular if the power semiconductor device is a MOSFET device with unipolar conduction ie. majority charge carriers only.

Figure 20:
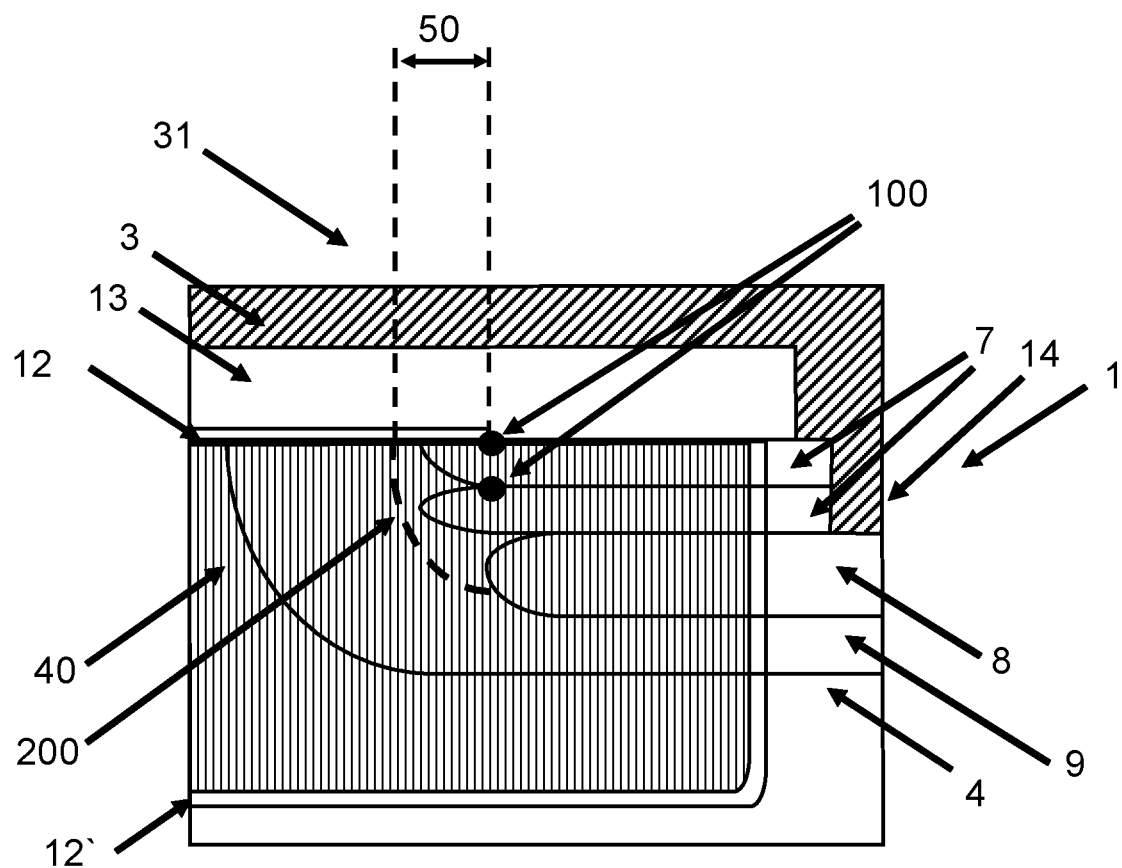
FIG. 20: shows the cross section of a twelfth example embodiment of a transistor cell according to the invention.

In further embodiments, the source region may be formed of multiple layers, each layer produced, for example, by a separate ion implantation step. Such an embodiment is depicted in FIG. 20, wherein it can be seen that each of the multiple layers of the source region has a corresponding singular point 100, therefore the power semiconductor device has multiple singular points 100 on the same lateral wall of an active trench region. This embodiment is especially relevant for wide bandgap materials in which the diffusion of impurities is non-existing of very limited. Each of the singular points 100 of the source region will define a MOS channel on the lateral wall of an active trench region, as described previously. Because there are multiple singular points on the same lateral wall of an active trench region, the total MOS channel width is increased compared to the other embodiments.

Furthermore, in other embodiments it may be possible that the power semiconductor is made of a multitude of different transistor cells, but not all cells may be of the same design. For example, the power semiconductor device may be formed with some transistor cells having the first exemplary embodiment, and with some transistor cells having a different design covered in the previous embodiments, or in the prior art.

It is also possible to apply the invention to power semiconductor devices, in which the conductivity type of all layers is reversed, i.e. with a lightly p doped drift layer etc.

In most applications, power semiconductors are not used in bare die form. Therefore, in a further embodiment to this patent application, multiple power semiconductors of any of the previous embodiments may be mounted as single or parallel connected chips on a substrate using techniques such as soldering or sintering. An additional enclosure, protective layers, sensors, and internal/external metal connectors are usually added to form the basis for a power module, with the role of protecting the power semiconductors from damaging environmental factors (mechanical pressure, humidity, high temperatures, electrical discharges etc).

The power modules may be subsequently used in power converters that control the flow of electrical current between a source and a load. The source may be a DC type battery for example, and the load may be an electrical motor.

REFERENCE LIST

1: inventive power semiconductor device cell
3: emitter metallization (electrode)
31: emitter side
2: collector metallization (electrode)
21: collector side
4: drift layer, substrate
5: buffer layer
6: collector layer
7: n source layer
8: p second base layer
9: p first base layer
10: second gate electrode, electrically conductive layer
11: first gate electrode, electrically conductive layer
11'trench region
12: second insulating layer
12'first insulating layer
13: third insulating layer
14: emitter contact opening
15: horizontal channel for planar gate
16: vertical channel for trench gate
17: enhancement layer
18: collector shorts
40: active lateral trench wall i.e. inversion layer is formed, and there is contact with the source region
50: separation region between the singular point 100 and the highest doping concentration region in the first base layer (in the second dimension)
60: separation region between the singular point 100 and the first edge of the second base layer (in the second dimension)
70: distance between the singular point in the source region, and the first end wall of an adjacent trench region (in the second dimension)
80: trench width
90: first end trench wall extending in third dimension
90': second end trench wall extending in third dimension
100: singular point close to the edge of the mask for source region ion implantation, where the surface doping concentration in the source region reaches a maximum value
200: MOS cell channel width according to the invention
200': point of maximum dopant concentration in the first base layer
201: MOS cell channel width (prior art)
300: trench MOS cell power semiconductor device (prior art)
400: planar MOS cell power semiconductor device (prior art)

The invention claimed is:

1. A power semiconductor device comprising a plurality of transistor cells with a first surface and a second surface separated in a first dimension, wherein an emitter electrode is operatively connected to the first surface and a collector electrode is operatively connected to the second surface, and wherein each cell of the power semiconductor device further comprises:
a drift layer of a first conductivity type located between the first surface and the second surface;
a source region of the first conductivity type operatively connected to the emitter electrode, formed by ion implantation through a source mask, with a doping concentration greater than a doping concentration of the drift layer, and having a singular point on the edge of the said source mask;
a first base layer of a second conductivity type opposite of the first conductivity type, extending in the first dimension from the first surface towards the drift layer, extending outwards beyond the source region in a second dimension, having a position of maximum surface doping concentration spaced apart, in the second dimension, by a first separation region from the singular point;
a second base layer of the second conductivity type located within the first base layer and extending deeper than the source region in the first dimension, having a doping concentration greater than a doping concentration of the first base layer, having at least a region/point operatively connected to the emitter electrode via a contact opening;
a plurality of trench regions, each comprising a first gate electrode and a first insulating layer, the first insulating layer electrically insulating the first gate electrode from the first base layer, the second base layer, the source region and the drift layer, with at least one trench region abutting the source region such that the singular point is on a lateral trench wall abutting the source region;

a second insulating layer on the first surface of the drift layer in contact with the first base layer, source region and drift layer; and, a third insulating layer electrically insulating the emitter electrode from the first gate electrodes;

wherein the source region, the first base layer, and the second base layer extend longitudinally in a top plane view in a third dimension;

wherein the plurality of the trench regions extends in a top plane view at an angle greater than 0 degrees with respect to the third dimension;

wherein the first insulating layer and the first base layer are configured to form a cell MOS channel on the lateral walls of the plurality of trench regions, characterized in that a width of the cell MOS channel is defined by a segment of a circle arranged on the lateral walls of the plurality of trench regions and centered on the singular point with a radius equal to the first separation region.

2. The power semiconductor device comprising a plurality of transistor cells according to claim 1, wherein the position of the first end of the second base layer is aligned, in the second dimension, with the position of the singular point, wherein the effective total channel width $W_{total}$ is determined by $$W_{total}=N_{active} \times \pi \times L_{50}/2,$$

wherein, $N_{active}$ is a number of active lateral trench walls across the plurality of transistor cells, and $L_{50}$ is a length of the first separation region.

3. The power semiconductor device comprising a plurality of transistor cells according to claim 1, wherein, in the second dimension, the first end of the second base layer and the singular point are spaced apart by a second separation region, wherein at least one trench region abuts the second base layer, wherein the effective total channel width $W_{total}$ is determined by $$W_{total} = N_{active} \times \left( \pi \times \frac{L_{50}}{2} + L_{60} \right),$$

and wherein, $N_{active}$ is a number of active lateral trench walls across the plurality of transistor cells, $L_{50}$ is a length of the first separation region, and $L_{60}$ is a length of the second separation region.

4. The power semiconductor device comprising a plurality of transistor cells according to claim 1, wherein, in the second dimension, the first end of the second base layer and the singular point are spaced apart by a second separation region, characterized in that a second separation region has a length greater than 0, wherein at least one trench region does not abut the second base layer wherein the effective channel width $W_{total}$ can be determined by $$W_{total} = N_{active} \times \left( \pi \times \frac{L_{50}}{2} + L_{70} \right) + N^Z_{active} \times L_{80},$$

and wherein, $N_{active}$ is a number of active lateral trench walls across the plurality of transistor cells, $N^Z_{active}$ is a number of end trench walls across the plurality of transistor cells that do not abut the second base layer, $L_{50}$ is a length of the first separation region, $L_{70}$ is a distance, in the second dimension, between the singular point and a first end wall of the trench region, and $L_{80}$ is a width of a trench region.

5. The power semiconductor device comprising a plurality of transistor cells according to claim 1, wherein the first base layer is uniformly arranged on the drift layer, such that the drift layer is not in direct contact with the second insulating layer at the first surface.

6. The power semiconductor device comprising a plurality of transistor cells according to claim 1, wherein a first end wall of the trench recesses is arranged within the source region, and a second end wall of the trench recesses is arranged within the drift layer.

7. The power semiconductor device comprising a plurality of transistor cells according to claim 1, wherein a first end wall of the trench recesses is arranged within the source region, and a second end wall is arranged within the first base layer.

8. The power semiconductor device comprising a plurality of transistor cells according to claim 1, wherein the source region is omitted in at least one transistor cell, so that at least two lateral walls of adjacent trench regions do not abut on a source region.

9. The power semiconductor device comprising a plurality of transistor cells according to claim 1, wherein the source region is formed of multiple layers, each layer having a corresponding singular point on the same lateral trench wall abutting the source region.

10. The power semiconductor device comprising a plurality of transistor cells according to claim 9, wherein the first insulating layer, the first base layer, and each of the multiple layers of the source region, are configured to form a corresponding MOS channel, on the lateral walls of the plurality of trench regions, each MOS channel being connected to one of the multiple layers.

11. The power semiconductor device comprising a plurality of transistor cells according to claim 1, wherein a second gate electrode is arranged on the first base layer, the source region and the drift layer, wherein the second gate electrode is electrically insulated from the first base layer, the source region, the first gate electrodes, and the drift layer by the second insulating layer, and from the emitter electrode by a third insulating layer; characterized in that the first insulating layer is thinner than the second insulating layer.

12. The power semiconductor device comprising a plurality of transistor cells according to claim 1, wherein:

the plurality of trench regions is shaped with respective stripes;

the first base layer, the source region and the second base layer are shaped with respective stripes forming an angle greater than 0 with the respective stripes of the trench regions; and the respective stripes of the first base layers, source region and second base layer are divided into segments separated from each other by the respective stripes of the trenches.

13. The power semiconductor device comprising a plurality of transistor cells according to claim 1, wherein:

the first base layer, the source region and the second base layer are shaped with respective stripes;

the plurality of trench regions is shaped with respective stripes forming an angle greater than 0 with the respective stripes of the first base layer, the source region and the second base layer; and the respective stripes of the plurality of trench regions are divided into segments separated from each other by the respective stripes of the first base layer, the source region and the second base layer.

14. The power semiconductor device comprising a plurality of transistor cells according to claim 1, wherein at least one of the first gate electrodes is electrically connected to the emitter electrode.

15. The power semiconductor device comprising a plurality of transistor cells according to claim 1, wherein at least one of the first gate electrodes is electrically floating.

16. The power semiconductor device comprising a plurality of transistor cells according to claim 1, further comprising:
a buffer layer of the first conductivity type arranged between the drift layer and the second surface, wherein a doping concentration of the buffer layer is greater than the doping concentration of the drift layer; and
a collector layer of the second conductivity type arranged between the drift layer and the second surface.

17. The power semiconductor device according to claim 1, further comprising:
a buffer layer of the first conductivity type arranged between the drift layer and the second surface, wherein a doping concentration of the buffer layer is greater than the doping concentration of the drift layer; and
a collector layer of the second conductivity type arranged between the drift layer and the second surface, wherein the buffer layer directly contacts the collector layer.

18. The power semiconductor device according to claim 17, wherein the power semiconductor is a reverse conducting power semiconductor device and the collector layer further comprises alternating first and second conductivity type arranged between the buffer layer and the second surface.

19. The power semiconductor device according to claim 17, wherein an enhancement layer of the first conductivity type is arranged between the drift layer and the first base layer separating the drift layer and the first base layer, and wherein a doping concentration of the enhancement layer is greater than the doping concentration of the drift layer.

20. The power semiconductor device according to claim 1, wherein the power semiconductor has a stripe layout design or cellular layout design.

21. The power semiconductor device according to claim 1, wherein at least the drift layer is formed of a wide bandgap material.

22. A power semiconductor device comprising a plurality of transistor cells, with at least one cell according to claim 1.

23. A semiconductor module package comprising one or more power semiconductor devices according to claim 1.

24. A power converting apparatus configured to convert an input voltage into a required voltage, wherein the required voltage is a direct-current or an alternating-current voltage, and output the required voltage, wherein the power converting apparatus comprises a plurality of power semiconductor devices or modules according to claim 1.

* * * * *